(12) United States Patent
Ito et al.

(10) Patent No.: US 7,294,856 B2
(45) Date of Patent: Nov. 13, 2007

(54) ELECTRO-OPTICAL DEVICE AND ELECTRONIC APPARATUS

(75) Inventors: Tomoyuki Ito, Okaya (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 277 days.

(21) Appl. No.: 10/961,221

(22) Filed: Oct. 12, 2004

(65) Prior Publication Data
US 2005/0112341 A1 May 26, 2005

(30) Foreign Application Priority Data
Nov. 11, 2003 (JP) ............... 2003-381275
Nov. 19, 2003 (JP) ............... 2003-389292
Sep. 2, 2004 (JP) ............... 2004-255276

(51) Int. Cl.
*H01L 29/04* (2006.01)
*H01L 31/20* (2006.01)

(52) U.S. Cl. .................. 257/72; 257/59; 257/79; 257/99; 257/82; 257/88; 257/5; 257/13; 257/68; 257/81

(58) Field of Classification Search .......... 257/59, 257/72, 79, 99, 82, 88, 5, 13, 68, 81; 313/500, 313/463, 504, 505, 466, 112
See application file for complete search history.

(56) References Cited

U.S. PATENT DOCUMENTS

| 6,476,988 | B1 | 11/2002 | Yudasaka |
| 6,806,504 | B2 | 10/2004 | Park |
| 7,012,367 | B2 | 3/2006 | Seki |
| 2002/0075422 | A1 | 6/2002 | Kimura et al. |
| 2003/0054186 | A1 | 3/2003 | Miyashita et al. |

FOREIGN PATENT DOCUMENTS

| EP | 0 989 778 A1 | 3/2000 |
| JP | A-11-271753 | 10/1999 |
| JP | A-11-329741 | 11/1999 |
| JP | A 2001-093666 | 4/2001 |
| JP | B2-3328297 | 7/2002 |
| JP | 2003-249378 A | 9/2003 |
| JP | 2004-319119 A | 11/2004 |
| KR | A 2003-0058151 | 7/2003 |
| WO | WO98-12689 A1 | 3/1998 |

*Primary Examiner*—Jerome Jackson
*Assistant Examiner*—Joseph Nguyen
(74) *Attorney, Agent, or Firm*—Oliff & Berridge, PLC

(57) ABSTRACT

To provide an electro-optical device comprising a thin film having a uniform thickness, which is formed by drying liquid droplets filled in a liquid droplet ejection region surrounded by a partition. An electro-optical device comprises partitions 22 for separating a plurality of regions formed on a substrate 10. Each of the partitions 22 has a lyophilic first partition 43 and a liquid-repellent second partition 44 which is formed on an upper surface portion of the first partition except for a circumferential portion surrounding the region of the first partition 43. The device also comprises a functional layer 45 which is formed on the region surrounded by the partition and includes at least a light emitting layer. The device further comprises a pair of electrodes 41 and 46 with the functional layer interposed therebetween, in which the first partition 43 has the thickness larger than the thickness of the functional layer 45, and a side inclined angle of the first partition 43 is less than the side inclined angle of the second partition 44.

8 Claims, 13 Drawing Sheets

ELECTRO-OPTICAL DEVICE AND ELECTRONIC APPARATUS

BACKGROUND OF THE INVENTION

1. Field of Invention

The present invention relates to an electro-optical device formed with an organic thin film and a semiconductor device, and to an electronic apparatus using the electro-optical device.

2. Description of Related Art

In recent years, an electro-optical device in which an organic light emitting diode element (hereinafter, suitably referred to as 'OLED element') is used as a pixel is being developed. The OLED element is generally referred to as an organic electroluminescent element or a light emitting polymer element. The OLED element has a construction in which an organic functional layer such as a light emitting layer is interposed between an anode and a cathode. In particular, nowadays, an electro-optical device is being developed by using a method in which an organic material-melted liquid material is arranged in a predetermined pattern on a substrate by means of an ink jet method. In such an electro-optical device, a partition member is provided on the substrate to divide pixels and then the organic liquid material is ejected to the regions surrounded by the partition member, such that it becomes possible to accurately form the organic functional layer on the substrate.

For example, in Patent Document 1, a construction in which a liquid repellency treatment is performed on a surface of a two-layered partition member of different materials and a liquid material is uniformly arranged on an electrode by the difference in affinity of the partition member for the liquid material is suggested.

[Patent Document 1] Japanese Patent Publication No. 3328297

DISCLOSURE OF THE INVENTION

FIG. 18 is a partial cross-sectional view of a conventional electro-optical device, and FIG. 19 is a diagram showing schematically a drying step of an organic functional layer in the conventional electro-optical device. An OLED element is provided at every pixel which is dividedly formed in a predetermined pattern on a substrate. A dividing member (hereinafter, referred to as partition) 242 is provided between adjacent pixels such that the ink ejected by an ink jet process is not drained out to adjacent pixels. The partition 242 has a first partition 243 formed to surround a liquid droplet ejection region $R_S$ on a pixel electrode (not shown) formed on a substrate 210, and a second partition 244 formed on an upper portion of the first partition 243. Here, cross-sectional surfaces has a step shape such that an opening portion of a lower surface of the second partition 244 becomes larger than an opening portion of an upper portion of the first partition 243. Further, the first partition 243 and the pixel electrode are made of a lyophilic inorganic material and the second partition 244 is made of a liquid-repellent organic material. In the respective liquid droplet ejection regions $R_S$ surrounded by such a partition 242, a surface of liquid droplets ejected with the ink jet process is filled to be swelled more than the upper surface of the second partition 244, as indicated by a line L1 of FIG. 19. And then, by drying the liquid droplets, the surface of the liquid droplets is gradually lowered as indicated by lines L1 to L4, and, the organic EL thin film 245 of which the surface is finally met with the line L4 is formed.

However, in a portion of the upper surface of the first partition 243, a flat portion 251 is provided in which the second partition 244 is not formed. Since the flat portion 251 is formed by the first partition 243, it has lyophilic property. For this reason, when the liquid droplets filled in the liquid droplet ejection region $R_S$ surrounded by the partition 242 are dried and its surface is lowered, there is a problem in that the liquid droplets 245a remains on the flat portion 251. As a result, with regard to the film thickness of the organic EL thin film 245 having formed by drying the liquid droplets, the circumferential portion of the liquid droplet ejection region $R_S$ becomes thin, causing the film thickness to be not uniform. Further, in the circumference of a portion in which the first partition 243 contacts the organic EL thin film 245, there is a problem in that the organic EL thin film 245 becomes not-uniform in that region.

Further, in the conventional electro-optical device, in order to increase the area for the light emitting region, the liquid droplet ejection region is required to have an exact rectangular shape, but it is difficult to form the organic EL thin film of which the height from the surface of the substrate is uniform, on the rectangular liquid droplet ejection region. As described above, due to the not-uniformity in the film thickness of the organic EL thin film or in the height of the surface, not-uniformity in the light emission brightness is consequently caused.

The present invention is made in consideration of the above problems, and it is an object of the present invention to provide an electro-optical device which comprising a thin film having a uniform thickness, the thin film being formed by drying liquid droplets filled in a liquid droplet ejection region surrounded by a partition. In addition, it is another object of the present invention to provide an electronic apparatus comprising the electro-optical device.

SUMMARY OF THE INVENTION

In order to solve the above problems and achieve the above objects, there is provided an electro-optical device of the present invention, which comprises a partition for separating a plurality of regions formed on a substrate, each partition having a lyophilic first partition which, in each region, has a side portion and an upper surface portion surrounding the region and a liquid-repellent second partition which is formed on at least a portion of the upper surface portion of the first partition, a functional layer which is formed on the region surrounded by the partition and has at least a light emitting layer, and a pair of electrodes with the functional layer interposed therebetween, in which the thickness of the first partition is larger than the thickness of the functional layer, and an inclined angle of the side portion of the first partition surrounding the region is less than an inclined angle of a side portion of the second partition surrounding the region. Moreover, the electro-optical device means a display device comprising an electro-optical element. The electro-optical element means an element of which optical characteristics changes depending on electrical reactions, and, for example, includes a liquid crystal, an organic EL light emitting diode, or the like.

According to this invention, a front end portion of the functional layer contacting the first partition is dragged upward, but it is possible to make the height of the portion from the surface of the substrate equal to the thickness of other functional layer from the surface of the substrate. Further, the thickness of the functional layer which is formed in the region surrounded by the lower surface of the first partition becomes uniform. Therefore, it has an advantage that light emission brightness in the region surrounded by the partition becomes uniform.

Further, according to a preferred aspect, in the above-mentioned invention, the second partition is formed to entirely cover the upper surface portion of the first partition. According to this invention, since the upper surface of the first partition does not appear, when the liquid droplets dropped in the region surrounded by the partition are dried, the liquid droplets are not dragged to the upper surface of the first partition. Further, the thickness of the functional layer which is formed on the region surrounded by the lower surface of the first partition becomes uniform. Therefore, since the thickness of the functional layer becomes uniform, it has an advantage that light emission brightness in the region surrounded by one partition becomes uniform.

Further, according to a preferred aspect, in the above-mentioned invention, the first partition has a lyophilic third partition having a side portion and an upper surface portion surrounding the region, and a lyophilic fourth partition which is formed on at least a portion of the upper surface portion of the third partition. According to this invention, the thickness of the auxiliary layer in the region surrounded by the lower surface portion of the third partition becomes uniform, and the height of the auxiliary layer in the region surrounded by the third partition becomes uniform. As a result, it is also possible to make the thickness of the light emitting layer to be formed on an upper portion of the auxiliary layer uniform. Therefore, it has an advantage that it is possible to make light emission brightness in the functional layer uniform.

Further, according to a preferred aspect, in the above-mentioned invention, the functional layer has an auxiliary layer, which is formed as a lower layer of the light emitting layer, for assisting light emission by the light emitting layer, the thickness of the third partition is larger than the thickness of the auxiliary layer, and the inclined angle of the side portion of the second partition is greater than inclined angles of the side portions of the third and fourth partitions. According to this invention, a front end portion of the auxiliary layer contacting the third partition is dragged upward, but the height of the portion from the surface of the substrate is maintained to the height equal to the height of other auxiliary layer from the surface of the substrate. Further, the thickness of the auxiliary layer in the region surrounded by the lower end portion of the third partition becomes uniform. Similarly, a front end portion of the light emitting layer formed on the auxiliary layer contacting the fourth partition is dragged upward, but the height of the portion from the surface of the substrate is maintained to the height equal to the height of other light emitting layer from the surface of the substrate. Further, the thickness of the portion of the light emitting layer to be deposited on an upper portion of the auxiliary layer becomes uniform. As a result, it has an advantage that it is possible to make light emission brightness in the region surrounded by the partition.

Further, according to a preferred aspect, in the above-mentioned invention, the functional layer has an auxiliary layer, which is formed as a lower layer of the light emitting layer, for assisting light emission by the light emitting layer, the thickness of the third partition is larger than the thickness of the auxiliary layer, and the thickness of the first partition is larger than the thickness of the functional layer. According to this invention, a front end portion of the auxiliary layer contacting the third partition is dragged upward, but the height of the portion from the surface of the substrate is maintained to the height equal to the height of other auxiliary layer from the surface of the substrate. Further, the thickness of the auxiliary layer surrounded by the lower end portion of the fourth partition becomes uniform. Similarly, a front end portion of the functional layer contacting the third partition or the fourth partition is dragged upward, but the height of the portion from the surface of the substrate is maintained to the height equal to the height of the functional layer from the surface of the substrate. Further, the thickness of the functional layer in the region surrounded by the lower end portion of the third partition becomes uniform. For this reason, the thickness of the light emitting layer becomes uniform. As a result, it has an advantage that it is possible to make light emission brightness in the region surrounded by the partition uniform.

Further, in the above-mentioned invention, the third partition has a lyophilic property higher than that of the fourth partition, and the second partition has a liquid repellency higher than that of the fourth partition. In the case in which the functional layer has a plurality of layers, at the time of forming a first layer of the functional layer, the third partition exhibits lyophilic property and the second partition or the fourth partition exhibits liquid repellency. Further, at the time of forming a second layer and other layers of the functional layer, the fourth partition exhibits lyophilic property and the second partition exhibits liquid repellency. According to this invention, it is possible to make the first layer of the functional layer uniform. For this reason, the thickness of the second layer and other layers of the functional layer become uniform.

Further, according to a preferred aspect, in the above-mentioned invention, the region has a polygonal shape, in an opening portion of the second or third partition, a cross-sectional surface shape in a horizontal plane direction has a round shape in the vicinities of angled portions of the region, and the width of a flat portion of the third or fourth partition in the vicinities of the angled portions is longer than the widths of other portions in the vicinities of the angled portions. According to this invention, in the respective angled portions of the region in which the functional layer is formed, the height of the functional layer is maintained to have the approximately same height as those of other portions of the region. As a result, it is possible to make the region, in which the functional layer is formed, in a polygonal shape such as a rectangular shape. Further, it has advantages that it becomes possible to widen the region to form the functional layer as compared with the prior art, and it is possible to increase light emission brightness in the region.

Further, according to a preferred aspect, there is provided an electro-optical device comprising a partition for separating a plurality of regions on a substrate, each partition having a lyophilic first partition which, in each region, has a side portion and an upper surface portion surrounding the region and a liquid-repellent second partition which is formed in at least a portion of the upper surface portion of the first partition, a functional layer which is formed on the region surrounded by the partition and has at least a light emitting layer, and a pair of electrodes with the functional layer interposed therebetween, in which a first opening portion of the first partition is formed wider than a second opening portion of the second partition.

According to this invention, as the substrate is observed from the side at which the partition is formed, a portion of the functional layer formed in the region is hidden by means of the second partition. The hidden portion is a portion at which the functional layer contacts the first partition and at which the height from the surface of the substrate has unevenness somewhat as compared with other portions. Since the portion is not a current path between the pair of electrodes, it has an advantage that light emission brightness in the region surrounded by the partition also becomes uniform.

Further, according to a preferred aspect, in the above-mentioned invention, the thickness of the first partition is larger than the thickness of the functional layer, and an angle at which a side portion of the second partition surrounding the region meets a surface parallel to a surface of the substrate is a right angle or an obtuse angle. According to this invention, since the first opening portion in a lower end of the first partition is formed wider than the second opening portion of the second partition, as the substrate is observed from the side at which the partition is formed, a portion of the functional layer formed in the region is hidden by means of the second partition and the first partition. The hidden portion is a portion at which the functional layer contacts the first partition and at which the height from the surface of the substrate has unevenness somewhat as compared with other portions. Thus, it has advantages that a current flowing in the functional layer corresponding to the portion is shut off by the insulating second partition, and light emission brightness in the region surrounded by the partition becomes uniform.

Further, according to a preferred aspect, in the above-mentioned invention, the functional layer has an auxiliary layer, which is formed as a lower layer of the light emitting layer, for assisting light emission by the light emitting layer, the thickness of the first partition is larger than the thickness of the auxiliary layer, and a lower surface portion of the second partition is formed to extend to the side of the region further than the upper surface portion of the first partition. According to this invention, the thickness of the auxiliary layer in the region surrounded by the first partition becomes uniform and also the height from the surface of the substrate becomes uniform. Further, since the first opening portion in an upper end of the first partition is formed wider than the second opening portion of the second partition, as the substrate is observed from the side at which the partition is formed, a portion of the functional layer formed in the region is hidden by means of the second partition and the first partition. Therefore, it has an advantage that it is possible to make light emission brightness in the light emitting layer to be formed in an upper portion of the auxiliary layer uniform.

Further, according to a preferred aspect of the present invention, an electronic apparatus comprises an electro-optical device as described in any one of the above-mentioned inventions. According to this invention, unevenness in thickness of the functional layer having the light emitting layer in each pixel is suppressed. Therefore, it is possible to make light emission brightness by the light emitting layer uniform and further it is possible to improve display quality of the electronic apparatus.

DETAILED DESCRIPTION OF PREFERRED EMBODIMENTS

Hereinafter, preferred embodiments of an electro-optical device and an electronic apparatus according to the present invention will be described with reference to the attached drawings. Meanwhile, in the embodiments, an electro-optical device (a semiconductor device) using an OLED element is exemplified, but the present invention is not limited to the embodiments. Further, cross-sectional views of the electro-optical device, which are used in the embodiments described below, are schematic. A relationship of thickness and width of a layer or a ratio of thickness of respective layers is different from that of the actual.

1. First Embodiment

Figure 1:
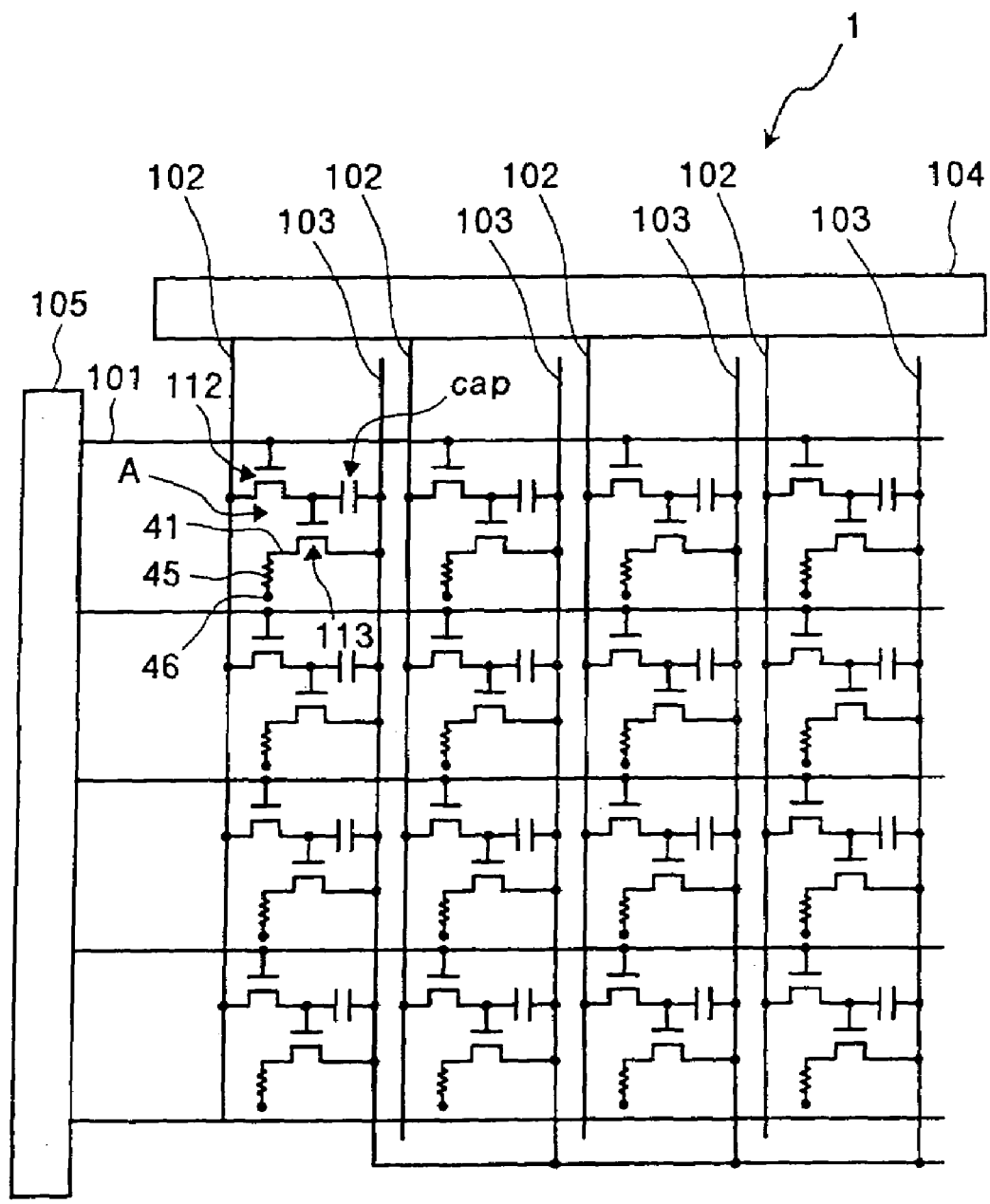
FIG. 1 is a planar schematic view of a wiring line structure of an electro-optical device according to the present invention.

FIG. 1 is a planar schematic view of a wiring line structure of an electro-optical device according to the present invention. As shown in FIG. 1, an electro-optical device 1 has a wiring line structure comprising a plurality of scanning lines 101, a plurality of signal lines 102 extending in a direction approximately orthogonal to the scanning lines 101 with a space interposed therebetween, and a plurality of power supply lines 103 extending parallel to the signal lines 102. And then, in the vicinities of respective intersections of the scanning lines 101 and the signal lines 102, pixel regions A are provided.

To the signal lines 102, a data driving circuit 104 comprising shift registers, level shifters, video lines and analog switches is connected. Further, to the scanning lines 101, a scanning side driving circuit 105 comprising shift registers and level shifters is connected.

In the respective pixel regions A, a switching TFT 112 of which a gate is supplied with a scanning signal via the scanning line 101, a storage capacitor cap for storing a pixel signal which is supplied from the signal line 102 via the switching TFT 112, a driving TFT 113 of which a gate is supplied with the pixel signal stored in the storage capacitor cap, a pixel electrode (anode) 41 into which a driving current is flowed from the power supply line 103, when being electrically connected to the power supply line 103 via the driving transistor 113, and a functional layer 45 interposed between the pixel electrode 41 and a counter electrode (cathode) 46 are provided. The pixel electrode 41, the counter electrode 46 and the functional layer constitute a light emitting element unit. Moreover, the functional layer 45 corresponds to an organic EL thin film including a light emitting layer described below.

According to such a wiring line structure of the electro-optical device 1, if the scanning line 101 is driven and the switching TFT 112 is turned on, a potential on the signal line 102 at that moment is stored in the storage capacitor cap, and depending on a state of the storage capacitor cap, on or off state of the driving transistor 113 are determined. And then, the current flows in the pixel electrode (anode) 41 from the power supply line 103 via a channel of the driving transistor 113, and further the current flows in the counter electrode (cathode) 46 via the functional layer 45. The functional layer 45 emits a light depending on the amount of the current therein. In such a manner, by controlling light emission in the pixel regions A, it is possible to display a desired state.

Figure 2:
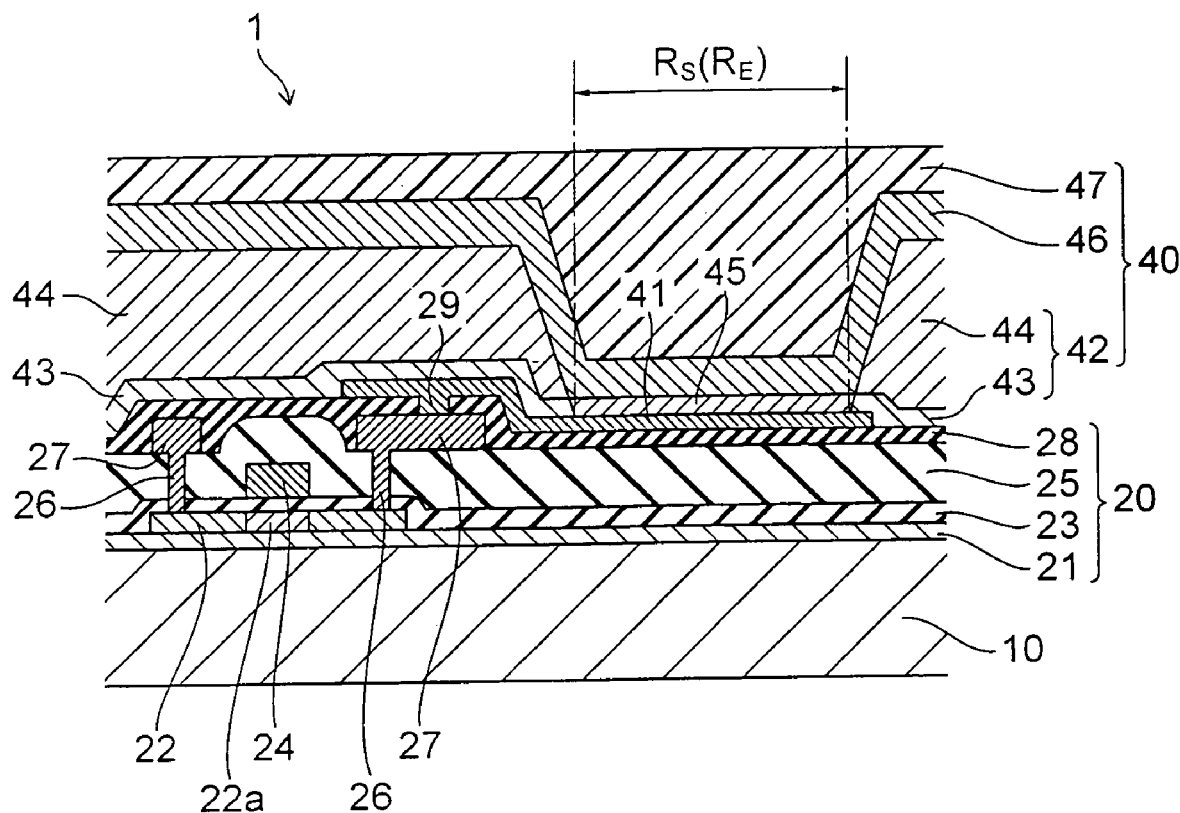
FIG. 2 is a cross-sectional schematic view of an electro-optical device according to the present invention.
Figure 3:
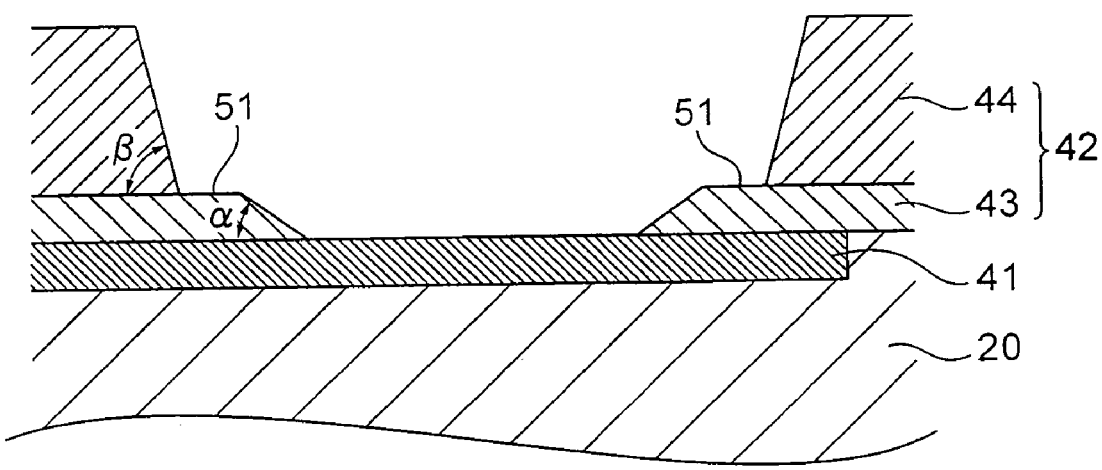
FIG. 3 is a cross-sectional schematic view of a first embodiment of an electro-optical device according to the present invention.

FIGS. 2 and 3 are cross-sectional views showing schematically a structure of a pixel region of an electro-optical device according to the present invention. FIG. 2 is a cross-sectional view showing a more detailed structure of parts of the functional layer 45 and the driving transistor 113 in FIG. 1, and FIG. 3 is an expanded cross-sectional view of a liquid droplet ejection region portion in which the functional layer 45 is formed in FIG. 2. The electro-optical device 1 comprises a substrate 10, a driving element unit 20 in which active elements such as TFTs or wiring lines are formed on the substrate 10, and a function element unit 40 in which an organic EL thin film is formed.

The substrate 10 may be made of various glass materials, resin materials, ceramics materials including single crystals or metallic materials, and a suitable substrate may be selected depending on uses. Meanwhile, in FIG. 2, a case in which a glass substrate is used as the substrate 10 is exemplified.

The driving element unit 20 comprises a switching TFT 112, a driving TFT 113, and other elements or wiring lines. For example, the driving TFT 113 is made of island-shaped polysilicon which is formed at a predetermined position on a base layer 21 made of $SiO_2$ or the like on the substrate 10. In FIG. 2, a cross-sectional view cutting the driving TFT 113 is drawn. The gate electrode 24 of the driving TFT 113 is electrically connected to the drain electrode of the switching TFT 112 of FIG. 1. Further, in the source and drain regions of the driving TFT 113, the source electrode 27 and the drain electrode 27 are formed via contact holes 26 which are formed in first and second interlayer insulating films 23 and 25. One of the source electrode 27 and the drain electrode 27 is electrically connected to the power supply line 103 of FIG. 1, and another is electrically connected to the pixel electrode 41 via a contact hole 29 which is formed in a third interlayer insulating film 28. Moreover, the first to third interlayer insulating films 23, 25 and 28 of the driving element unit 20 are made of an insulating material such as $SiO_2$.

The function element unit 40 comprises the functional layer 45, made of an organic EL thin film, including at least the light emitting layer, a pair of electrodes 41 and 46 for activating the functional layer 45, a partition 42 for forming the functional layer in a predetermined region, a sealing layer 47 for shielding the functional layer 45 from a peripheral atmosphere. Here, the terms of a pixel region and a liquid droplet ejection region in the present specification will be described. In the present specification, the liquid droplet ejection region $R_S$ represents a region, surrounded by the partition 42, in which the functional layer 45 is formed. Further, the pixel region represents a region, including the liquid droplet ejection region $R_S$, in which an active element for driving the functional layer 45 in the liquid droplet ejection region $R_S$ is formed, when an electro-optical device can perform monochrome display. In the case in which an electro-optical device can perform color display, if the pixel region in monochrome display is referred to as a sub-pixel region, three sub-pixel regions emitting respective colors of red, green and blue are collectively represented as the pixel region. Therefore, in each of the electro-optical device which can perform monochrome display and the electro-optical device which can perform color display, a range defined by the pixel region is different. Meanwhile, in the present specification, the electro-optical device which can perform monochrome display is exemplified. Therefore, in the case in which the present invention is applied to the electro-optical device which can perform color display, 'the pixel region' is needed to be rewritten into 'the sub-pixel region'.

The functional layer 45 is constructed to have at least the light emitting layer which performs light emission. There may be a case in which an auxiliary layer is provided to perform efficiently light emission in the light emitting layer, other than the light emitting layer. Here, the auxiliary layer represents layers having a function of increasing light emission in the light emitting layer, such as an electron injecting layer for increasing electron injection efficiency from the cathode to the light emitting layer, an electron transporting layer for shifting electrons to the light emitting layer and for blocking shifts of holes from the light emitting layer, a hole transporting layer for shifting holes to the light emitting layer and for blocking shifts of electrons from the light emitting layer, and a hole injecting layer for increasing hole injection efficiency from the anode to the light emitting layer.

Figure 20:
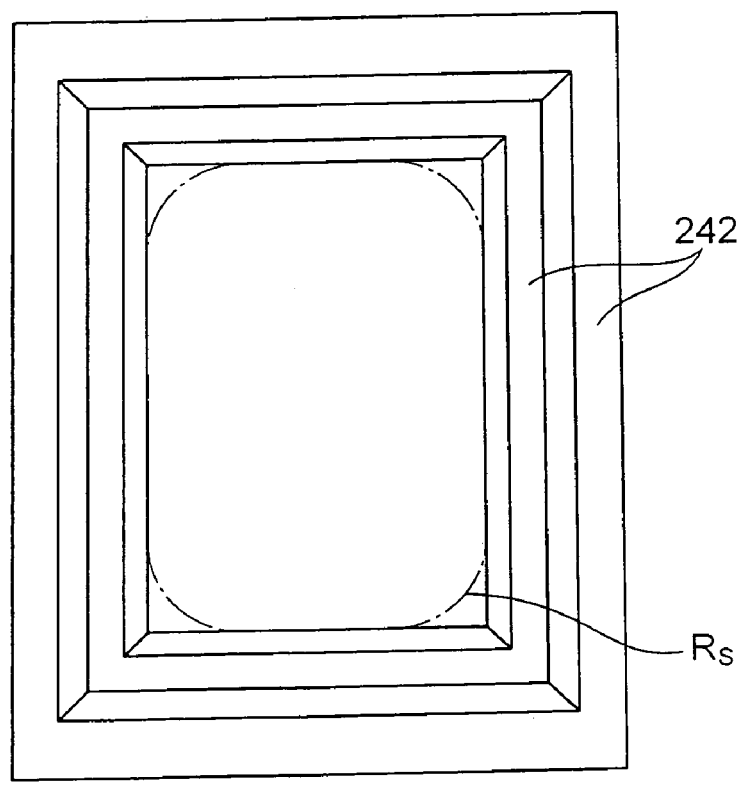
FIG. 20 is a plan view showing schematically a conventional electro-optical device.

The electrodes 41 and 46 are formed with the functional layer 45 interposed therebetween. Hereinafter, there may be a case in which the electrode 41 formed at the side of the substrate 10 is referred to as the pixel electrode, and the electrode 46 to be arranged oppositely to the pixel electrode is referred to as the counter electrode. In case of a top emission type electro-optical device 1 in which light emission is performed from the side at which the function element unit 40 is formed, the counter electrode 46 is formed with a transparent conductive material such as indium tin oxide (hereinafter, refers to as ITO), and the pixel electrode 41 is formed with a conductive material which is conventionally used for an electrode. Further, in case of a bottom emission type electro-optical device 1 in which light emission is performed from the side of the substrate 10, the pixel electrode 41 is formed with a transparent conductive material, and the counter electrode 46 is formed with a reflective and conductive material which is conventionally used for an electrode. In addition, in case of an electro-optical device 1 in which light emission is performed from both sides, the pixel electrode 41 and the counter electrode 46 are formed with a transparent conductive material together. In the example of FIG. 20, on the driving element unit 20, the anode (pixel electrode) 41, the functional layer, and the cathode (counter electrode) 46 are deposited in this order. Further, the sealing layer 47 is a layer formed on the cathode 46 such that vapor or oxygen in the air does not contact the functional layer 45, and may be made of various resin materials.

The partition 42 comprises a lyophilic first partition 43 which is formed on the driving element unit 20 to surround the liquid droplet ejection region $R_S$, and a liquid-repellent second partition 44 which is formed on the first partition 43. Here, cross-sectional surfaces of the first partition 43 and the second partition 44 are constructed in a step shape such that an opening portion of a lower surface of the second partition 44 is larger than an opening portion of an upper surface of the first partition 43. That is, in the upper surface of the first partition 43, a flat portion 51 is formed. The first partition 43 may be made of a lyophilic inorganic material such as $SiO_2$ or $TiO_2$, and the second partition 44 may be made of a liquid-repellent material. Alternatively, the second partition 44 may be made of a material which obtains a liquid-repellent property (for example, Teflon(R)) through a plasma treatment even though it has no liquid-repellent property inherently. As the second partition 44, an organic insulating material, such as polyimide resin or acryl resin, which can obtain a liquid-repellent property through the plasma treatment such that shows an excellent adherence to the underlying first partition 43 and can be easily patterned with a photolithography method, may be included.

Here, the first partition 43 is formed to have a thickness larger than the thickness of the functional layer 45 to be formed. In such a manner, if the thickness of the first partition 43 is larger than the thickness of the functional layer 45, the resultant thin film of the functional layer 45 does not contact the liquid-repellent second partition 44, and thus there is no case in which the thin film is swelled.

Figure 4A:
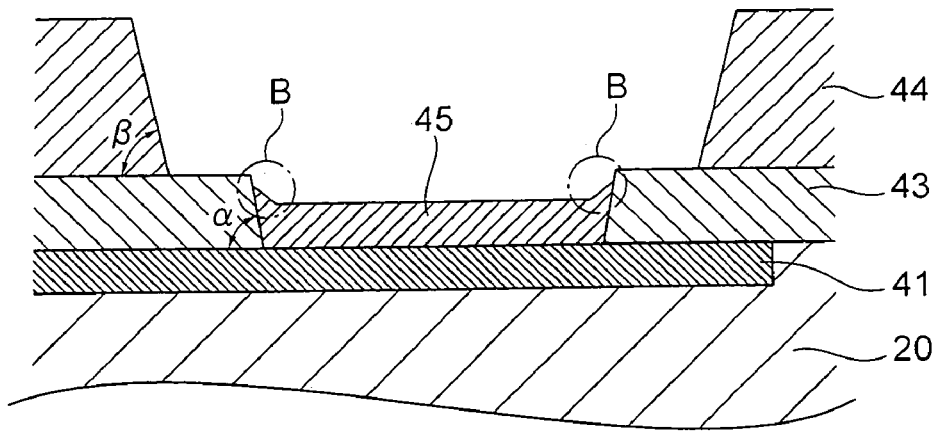
FIG. 4A is a diagram showing schematically a state of a contact portion of a functional layer and a first partition.
Figure 4B:
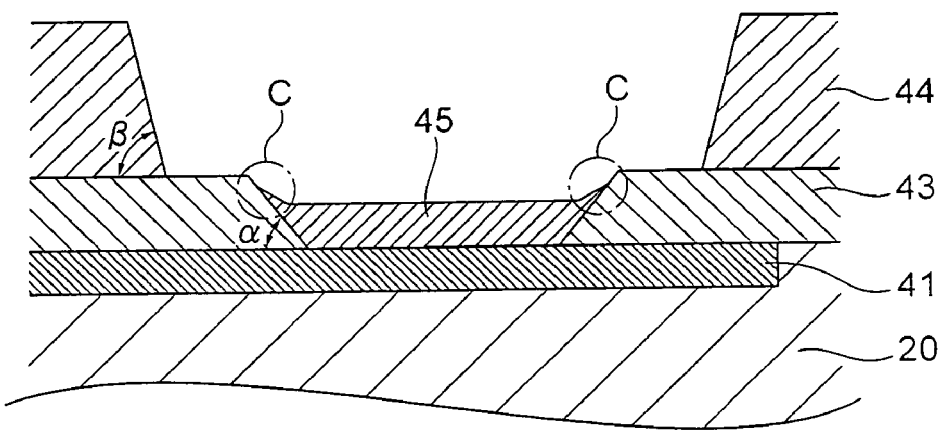
FIG. 4B is a diagram showing schematically a state of a contact portion of a functional layer and a first partition.

Further, a side inclined angle α of the first partition 43 is less than a side inclined angle β of the second partition 44. FIG. 4A is a cross-sectional view of a partition portion when the side inclined angle of the first partition is larger than the side inclined angle of the second partition, and FIG. 4B is a cross-sectional view of a partition portion when the side inclined angle of the first partition is less than the side inclined angle of the second partition. Liquid droplets made of a material constituting the functional layer 45 are ejected in the liquid droplet ejection region surrounded by the partition 42. Here, a contact portion B of a surface of the functional layer which is formed by drying the liquid droplets and the first partition 43 is dragged upward by the first partition 43 having lyophilic property, though it is a little (see FIG. 4A). However, a height of a front end portion of the functional layer 45, which is dragged by the first partition 43, from the substrate surface becomes small as the side inclined angle α of the first partition 43 becomes small. Therefore, as shown in FIG. 4B, by making the side inclined angle α of the first partition 43 less than the side inclined angle β of the second partition 44, it is possible to prevent the height of a front end portion of a contact portion C of the surface of the functional layer 45 and the first partition 43 from the substrate surface from being larger than those of other portions. As a result, unevenness in height of the surface of the functional layer 45 is suppressed.

By constructing the partition 42 in such a manner, even though the thin film is formed by drying liquid droplets which are dropped in the liquid droplet ejection region with an ink jet process or the amount of liquid droplets to be dropped is changed somewhat, the liquid droplets are dried which maintaining a uniform thickness, and further the height of the surface of the functional layer 45 from the surface of the substrate 10 after drying is overall maintained approximately uniformly.

Figure 5:
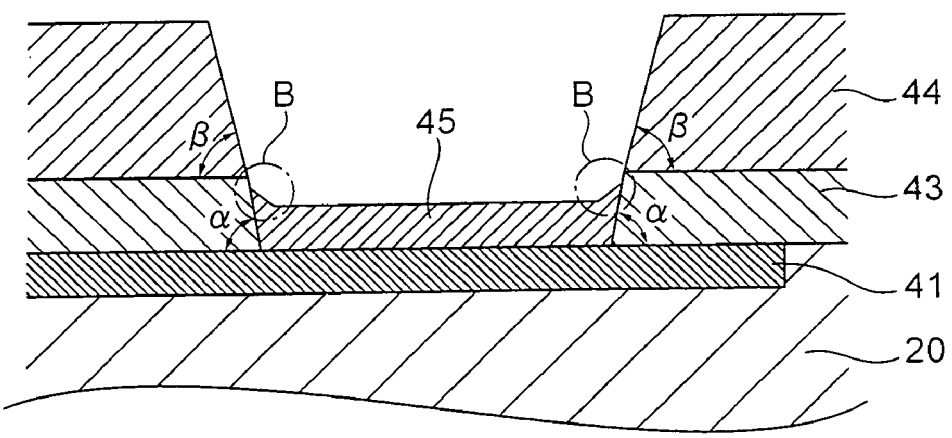
FIG. 5 is a diagram showing schematically a state of a contact portion of a thin film and a first partition.
Figure 6:
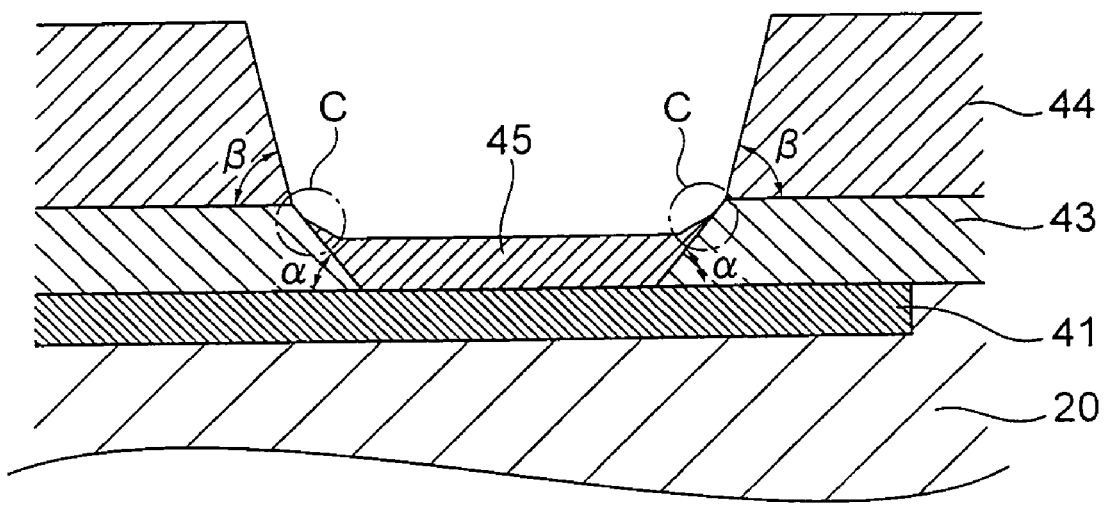
FIG. 6 is a diagram showing schematically a state of a contact portion of a thin film and a first partition.

The partition 42 comprises a lyophilic first partition 43 which is formed on the driving element unit 20 to surround the liquid droplet ejection region $R_S$, and a liquid-repellent second partition 44 which is formed on the first partition 43. The second partition 44 is preferably formed on the first partition 43 such that an upper surface portion of the first partition 43 does not appear as viewed from an upper portion. That is, as shown in FIG. 5, the cross-sectional shapes of the first partition 43 and the second partition 44 constituting the partition 42 are not in a step shape. Instead, it is constructed such that side wall surfaces of the first partition 43 and the second partition 44 surrounding the liquid droplet ejection region are connected vertically to each other with a boundary interposed therebetween. In addition, as shown in FIG. 6, the first and second partitions 43 and 44 are preferably formed such that the inclined angle α of the side wall surface of the first partition 43 becomes less than the inclined angle β of the side wall surface of the second partition 44.

By constructing the partition 42 in such a manner, even when the thin film is formed by drying the liquid droplets which are dropped in the liquid droplet ejection region with the ink jet process, there is no case in which the liquid droplets are left in a portion of the lyophilic first partition 43. Further, since the first partition 43 has a thickness sufficiently larger than the thickness of the functional layer 45 to be dried, even though the amount of the liquid droplets to be dropped is changed somewhat, the liquid droplets are dried while maintaining the uniform thickness. Further, as shown in FIGS. 4A and 4B, it is possible to prevent the height of the front end portion of the contact portion C of the surface of the functional layer 45 and the first partition 43 from the substrate surface from being larger than those of other portions. As a result, unevenness in height of the surface of the functional layer 45 is suppressed.

Figure 7:
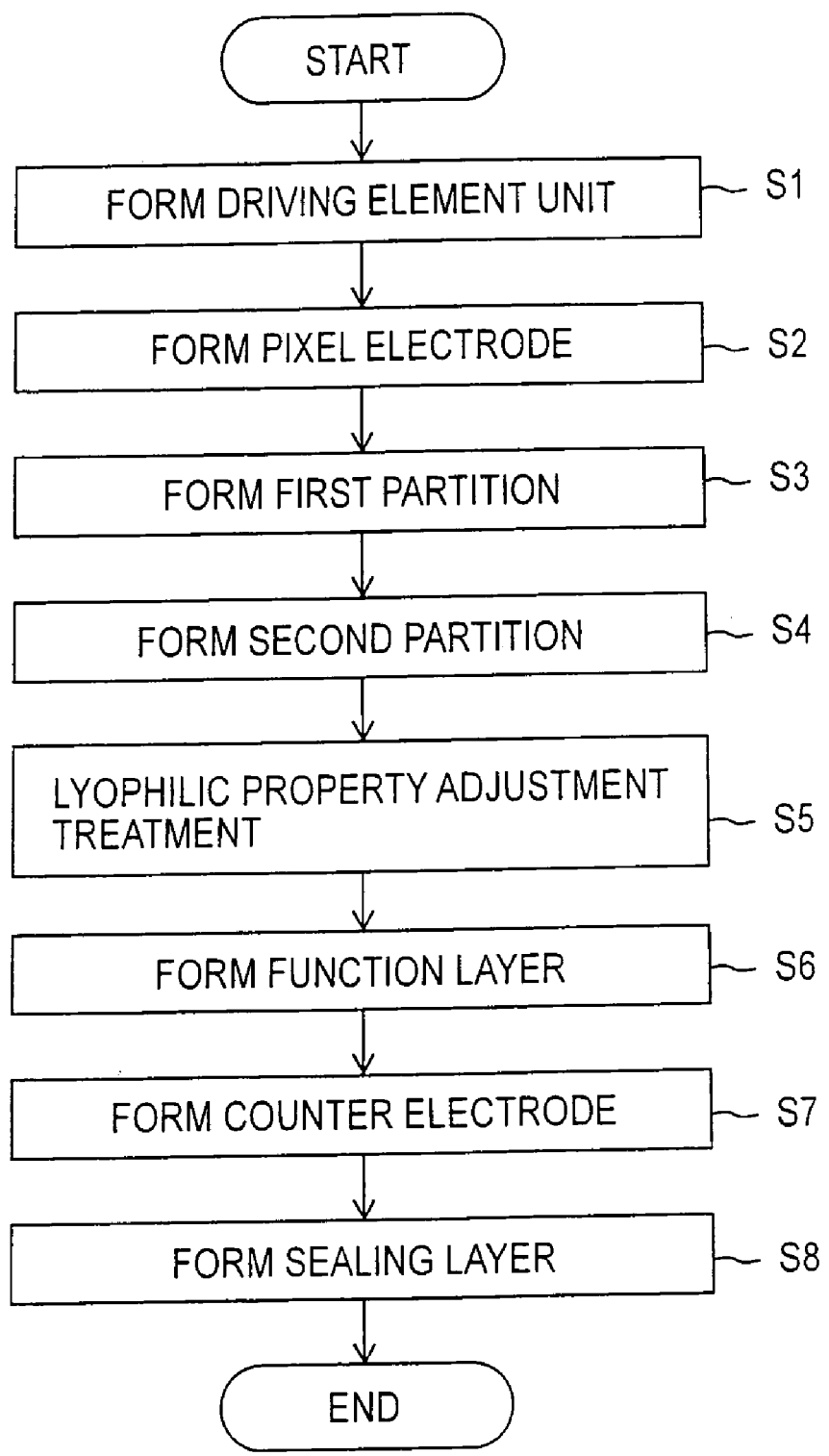
FIG. 7 is a flowchart showing a manufacturing process of an electro-optical device.

Here, an example of a manufacturing method of an electro-optical device according to the present invention will be described. FIG. 7 is a flowchart showing steps of a manufacturing method of an electro-optical device according to the present invention, and FIGS. 8A to 8H are cross-sectional views showing schematically steps of a manufacturing method of an electro-optical device according to the present invention.

Figure 8A:
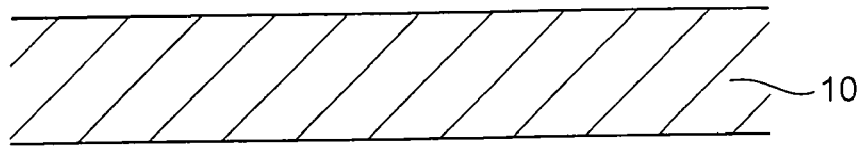
FIG. 8A is a cross-sectional schematic view showing a manufacturing process of an electro-optical device.
Figure 8B:
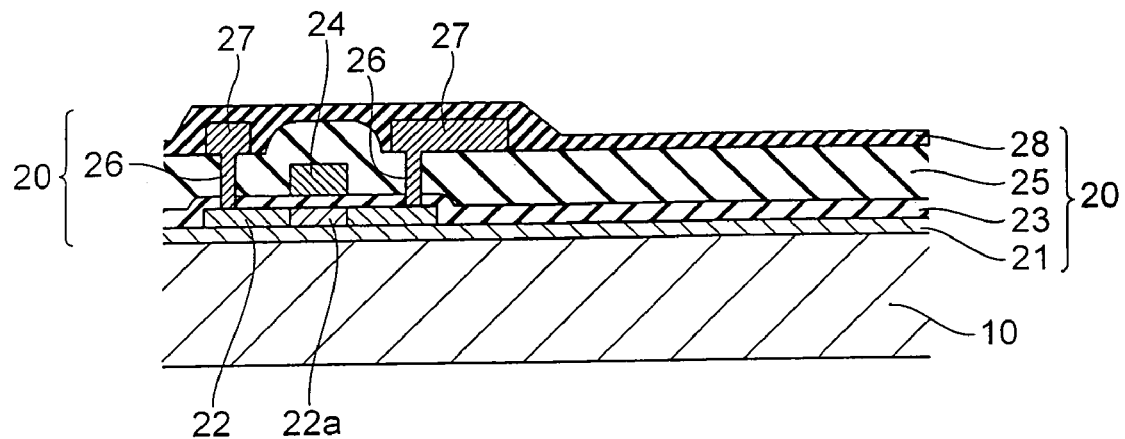
FIG. 8B is a cross-sectional schematic view showing a manufacturing process of an electro-optical device.
Figure 8C:
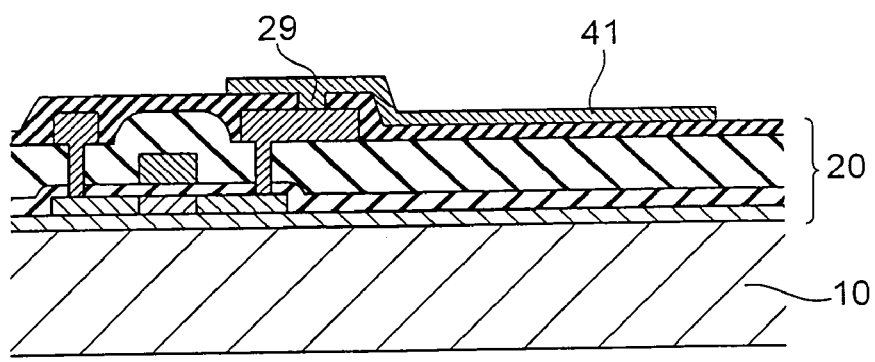
FIG. 8C is a cross-sectional schematic view showing a manufacturing process of an electro-optical device.

To begin with, in a driving element unit forming step, wiring lines such as the scanning lines 101 and the signal lines 102 or active elements such as the switching TFTs 112 and the driving TFTs 113 are formed on the substrate 10 (step S1, FIGS. 8A and 8B). For example, as shown in FIG. 8B, in the case in which the driving TFT 113 is formed, first, the base layer 21 made of $SiO_2$ is formed on the substrate 10, and then an amorphous silicon film is deposited thereon with film-forming means such as a plasma CVD (Chemical Vapor Deposition). Subsequently, by melting, cooling and solidifying the amorphous silicon film with a laser annealing, a polysilicon film is formed. And then, etching is performed such that only the polysilicon film 22 of a predetermined size at predetermined positions on the substrate 10, at which the driving TFT 113 is formed, is remained. Subsequently, the first interlayer insulating film 23 is formed to cover the polysilicon film 22 and the surface of the substrate 10, and the gate electrode 24 is formed on the first interlayer insulating film 23. A group V element is doped into the polysilicon film 22 except for a channel 22a via the gate electrode 24, such that source region and drain region are formed. Here, a region into which the group V element is not doped becomes the channel 22a. Subsequently, the second interlayer insulating film 25 is formed to cover the gate electrode 24 and the surface of the first interlayer insulating film 23, and two contact holes 26 are formed to pass through the first and second interlayer insulating films 23 and 25 and to reach the polysilicon film 22, with the gate electrode 24 interposed therebetween. And then, the source and drain electrodes 27 in the contact holes 26 and theirs peripheral portions are formed, and the third interlayer insulating film 28 is formed to cover the source and drain electrodes 27 and the surface of the second interlayer insulating film 25. In such a manner, the driving element unit 20 is formed.

Next, in a pixel electrode forming step, the contact hole 29 is formed to pass through the third interlayer insulating film 28 of the driving element unit 20 and to reach one of the source and drain electrodes 27. And then, a conductive material which constitutes the pixel electrode (in this example, the anode) 41 is formed on the driving element unit 20 with a sputter, a deposition or other film-forming means, and the resultant thin film made of the conductive material is patterned in a pixel electrode shape at a predetermined forming position of the liquid droplet ejection region (light emitting region) with a photo etching process (step S2, FIG. 8C). At this time, since the pixel electrode (anode) 41 is formed within the contact hole 29 formed in the third interlayer insulating film 28, the pixel electrode (anode) 41 of the function element unit 40 and any one terminal of the source and drain electrodes 27 of the driving TFT 113 are electrically connected to each other via the contact hole 29.

Figure 8D:
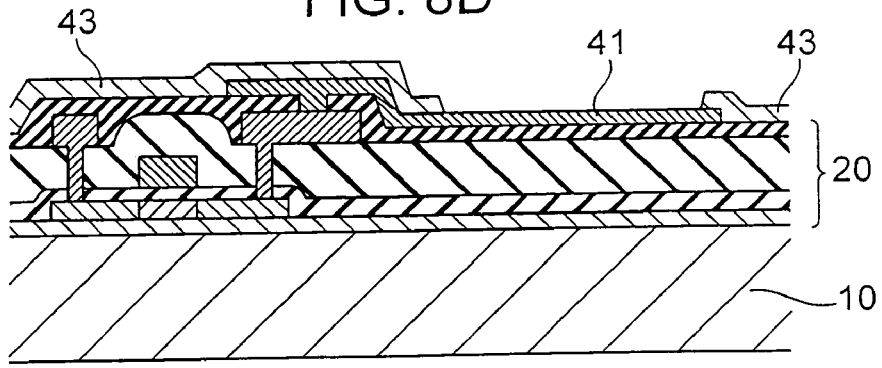
FIG. 8D is a cross-sectional schematic view showing a manufacturing process of an electro-optical device.

Next, in a first partition forming step, a $SiO_2$ film which constitutes the first partition 43 is formed on the patterned pixel electrode (anode) 41 and the third interlayer insulating film 28 and then it is patterned with the photo etching process such that the liquid droplet ejection region is opened in a predetermined shape on the pixel electrode (anode) 41 (step S3, FIG. 8D). At this time, the first partition 43 is formed to have the thickness sufficiently larger than the thickness of the functional layer 45 to be formed and to have the side inclined angle less than the side inclined angle of the second partition 44 to be formed subsequently. As a result, the first partition 43 is formed to run onto the peripheral portion of the pixel electrode (anode) 41. When the $SiO_2$ film is patterned with wet etching including fluoric acid, by suitably selecting a mixture ratio of fluoric acid, ammonium fluoride and acetic acid, it is possible to adjust the side inclined angle of the first partition 43. Further, in the photo etching process, by falling a hardening temperature of a photo resist a little, it is possible to make the side inclined angle of the first partition 43 small. The side inclined angle of the first partition 43 is preferably in a range of 5° and 60°. If the side inclined angle of the first partition 43 is less than 5°, the liquid droplet ejection region (light emitting region) is restricted, and if it is more than 60°, the amount of the functional layer 45 dragged to the first partition 43 becomes much. Thus, it is not preferable for the first partition 43 to have the side inclined angle of less than 5° and more than 60°. In particular, the side inclined angle of the first partition 43 is preferably in the range of 10° and 45°.

Figure 8E:
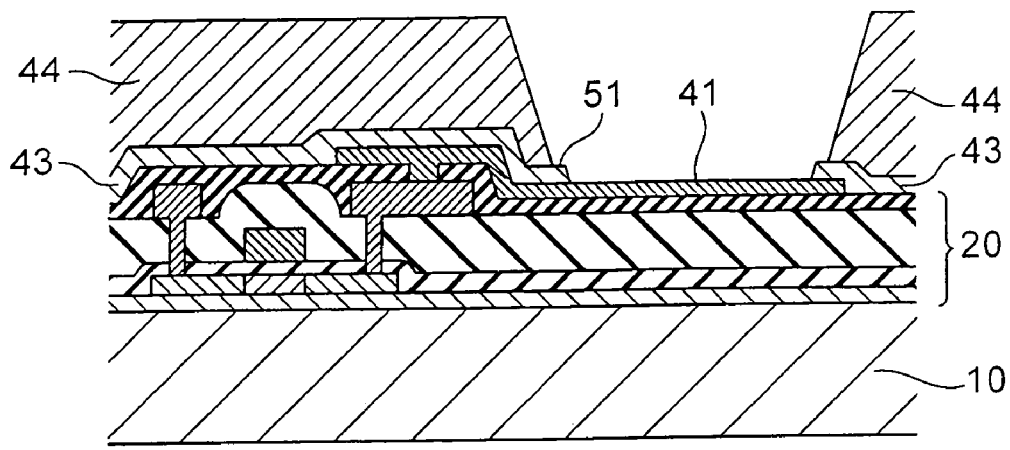
FIG. 8E is a cross-sectional schematic view showing a manufacturing process of an electro-optical device.

Next, in a second partition forming step, after a photosensitive insulating organic material is coated on the first partition 43 and the pixel electrode (anode) 41, ultraviolet ray is irradiated thereon via a photo mask, and then development is performed, such that the second partition 44 is formed to surround the liquid droplet ejection region (step S4, FIG. 8E). The second partition 44 is formed on the first partition 43, but, as described above, the opening portion of the lower surface of the second partition 44 is formed to have the size larger than that of the opening portion of the upper portion of the first partition 43. Thus, in a circumference of the opening portion of the upper surface of the first space 43, the flat portion 51 is formed. Further, an upper opening portion of the second partition 44 is formed to have the size wider than that of a lower opening portion thereof. The thickness of the second partition 44 is not particularly limited, but it is determined in consideration of the amount of a composition to be fed into the liquid droplet ejection region with the ink jet process in a functional layer forming step described later, an electrical parasitic capacitance which is generated with respect to a circuit board, and so on. When the photosensitive insulating organic material is patterned, coating of the material, pre-baking, ultraviolet irradiation, development and hardening are sequentially performed. In this situation, by bringing a pre-baking temperature close to a hardening temperature, it is possible to adjust the side inclined angle of the second partition 44 largely. In the case in which the second partition 44 is made of photosensitive acryl resin, by setting the pre-baking temperature to 170° C. or more and the hardening temperature to 220° C., it is possible to make the side inclined angle of the second partition 44 equal to or more than 60° C.

Next, in a lyophilic property adjustment treatment step, a treatment for adjusting a degree of the lyophilic property is performed on the surfaces of the pixel electrode (anode) 41, the first partition 43 and the second partition 44 (step S5). For example, an oxygen plasma treatment, a UV irradiation treatment or an exposure treatment to gas containing ozone is performed. Accordingly, since the surfaces the pixel electrode (anode) 41 and the first partition 43 have lyophilic property and are cleaned, a close adherence to the composition to be fed in the ink jet process described later increases. Subsequently, a fluorine plasma treatment using gas such as $CF_4$, $SF_6$, $CHF_3$ or the like is performed. In particular, since the second partition 44 is made of an organic material, the surface of the second partition 44 exhibits a liquid-repellent property as compared with the pixel electrode (anode) 41 or the first partition 43. Thus, patterning of the composition to be fed with ink jet process described below becomes favorable. Moreover, when the second partition 44 is formed with a material exhibiting a liquid-repellent property, the fluorine treatment may be performed. Further, the second partition 44 is formed on the first partition such that the upper surface portion of the first partition 43 does not appear as viewed from the upper portion, and then the plasma treatment is performed. Accordingly, since the upper surface of the first partition is not exposed to the fluorine treatment, there is no case in which the surface of the first partition 43 has a liquid-repellent property. Further, the side inclined angle of the first partition 43 is in a range of 15° and 45° and a fluorine plasma treatment having anisotropy to a vertical direction of the substrate is performed. Accordingly, it is possible to prevent the side surface of the first partition 43 from having a liquid-repellent property, as compared with the upper surface portion thereof. In addition, the side inclined angle of the first partition 43 is in the range of 30° and 70° and a fluorine plasma treatment having anisotropy to a vertical direction of the substrate is performed. Accordingly, it is possible to prevent the side surface of the first partition 43 having a liquid-repellent property, as compared with the case in which the side inclined angle of the first partition 43 is in the range of 10° and 45°.

Figure 8F:
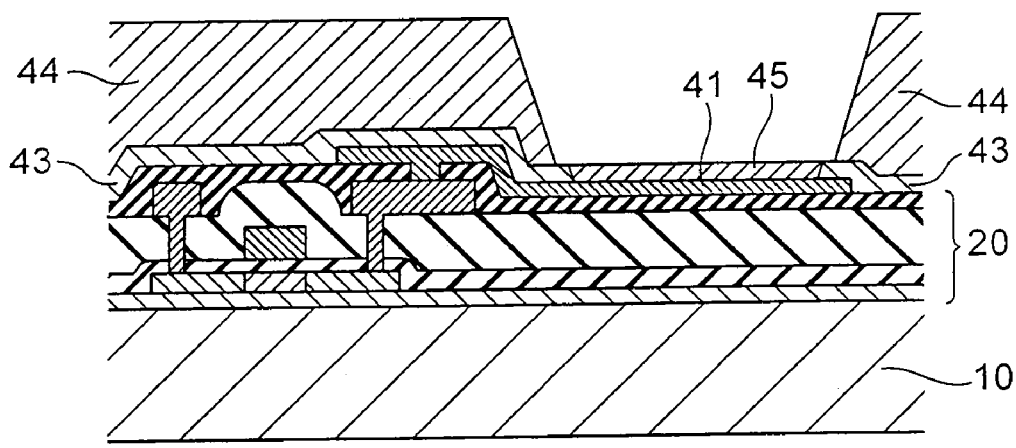
FIG. 8F is a cross-sectional schematic view showing a manufacturing process of an electro-optical device.

Next, in a functional layer forming step, a composition of a material constituting the light emitting layer or, in some cases, the composition of a material constituting the auxiliary layer is fed into the corresponding liquid droplet ejection region and is dried, such that the functional layer 45 is formed (step S6, FIG. 8F). Moreover, in the case in which the light emitting layer and the auxiliary layer are formed as the functional layer 45, after the composition of the material constituting one layer is dried, the composition of the material constituting another layer is fed into the liquid droplet ejection region and is dried, to thereby form the functional layer 45. Moreover, in the case in which the electro-optical device 1 can perform color display, compositions in which materials of red, green and blue are melted in a material constituting the light emitting layer are respectively ejected into the liquid droplet ejection regions.

Figure 8G:
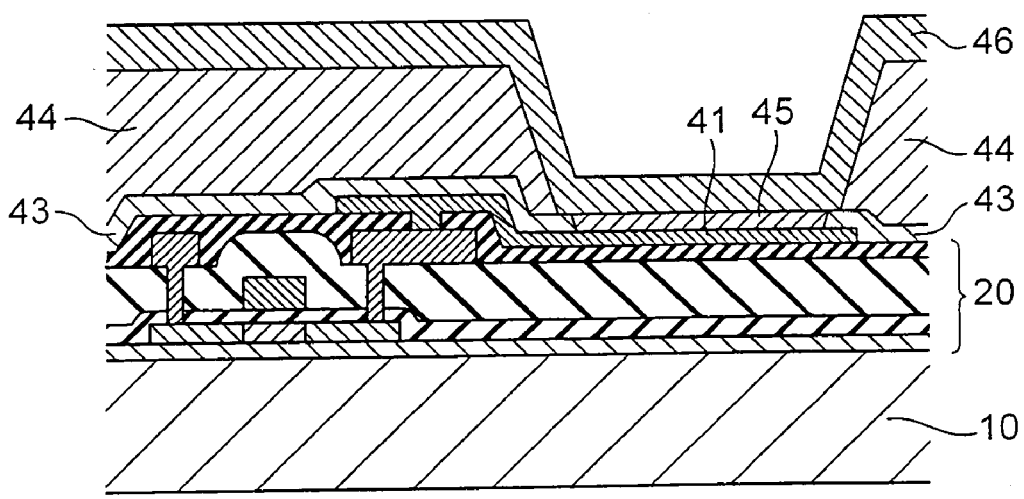
FIG. 8G is a cross-sectional schematic view showing a manufacturing process of an electro-optical device.

Next, in a counter electrode forming step, the cathode as the counter electrode 46 is formed on the functional layer 45 with the deposition, the sputter or other film-forming means, and it is patterned in a predetermined shape (counter electrode shape) (step S7, FIG. 8G).

Figure 8H:
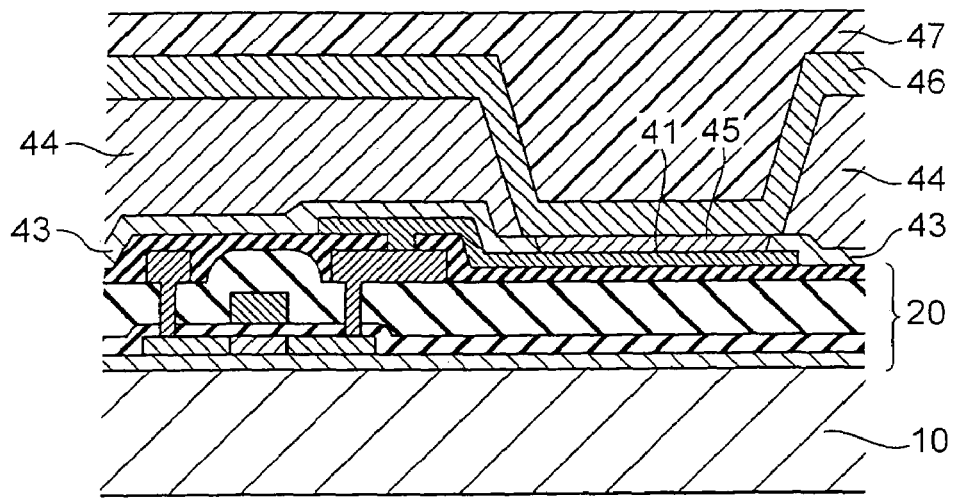
FIG. 8H is a cross-sectional schematic view showing a manufacturing process of an electro-optical device.

And then, in a sealing layer forming step, the sealing layer 47 is formed on the surface of the substrate on which the functional layer 45 is formed by means of the above-mentioned step (step S8, FIG. 8H). As the sealing layer 47, a resin material such as thermal setting epoxy-based resin, ultraviolet hardening epoxy-based resin or the like may be used. By providing the sealing layer 47, moisture or oxygen in the air is suppressed to penetrate into the function element unit 40, and deterioration due to a contact of the electrodes 41 and 46 or the functional layer 45 to moisture or oxygen is prevented. Through these steps, the electro-optical device 1 is manufactured.

Moreover, the driving element unit 20 and the function element unit 40 formed on the substrate 10 with the steps up to the above-mentioned step S4 are collectively referred to as a substrate for an electro-optical device.

According to the first embodiment, in the partition 42 comprised of the first and second partitions 43 and 44 surrounding the liquid droplet ejection region in which the functional layer 45 is formed, the thickness of the first partition 43 is sufficiently larger than the thickness of the function film and the side inclined angle of the first partition 43 is less than the side inclined angle of the second partition 44. Thus, when the liquid droplets constituting the functional layer 45 are ejected and dried in the liquid droplet ejection region to form the thin film, it is possible to form the functional film uniformly while suppressing unevenness of the surface thereof. As a result, for example, when the organic EL thin film is used as the functional layer, it has an advantage that it is possible to suppress unevenness of light emission brightness within one light emitting region.

2. Second Embodiment

Figure 9:
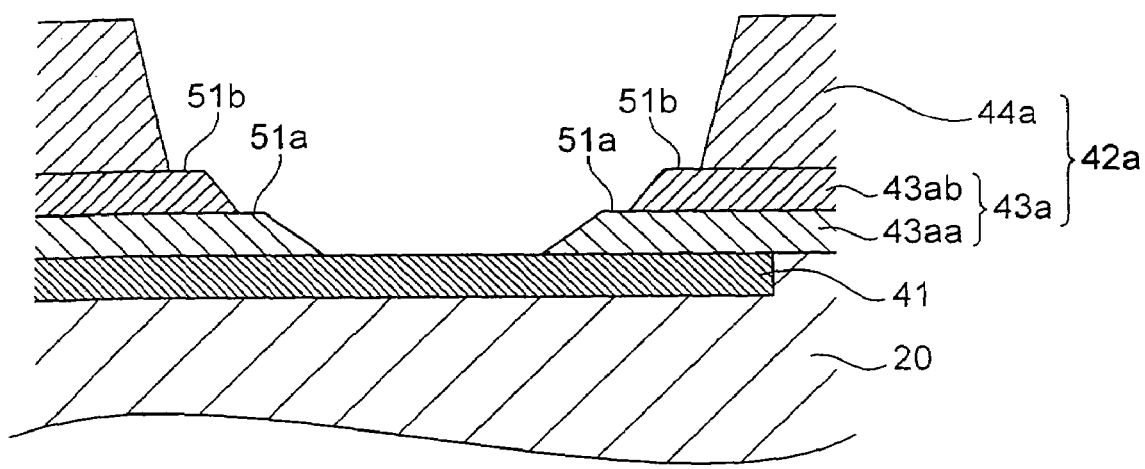
FIG. 9 is a cross-sectional schematic view of a second embodiment of an electro-optical device according to the present invention.

In a second embodiment, an electro-optical device in which the functional layer 45 comprises at least the light emitting layer and the auxiliary layer formed in a lower portion of the light emitting layer will be described. FIG. 9 is a cross-sectional view of essential parts of the second embodiment of an electro-optical device according to the present invention. The electro-optical device is characterized in that a first partition 43a is a two-layered structure of a third partition 43aa and a fourth partition 43ab, and a partition 42a is a three-layered structure. The partition comprises the lyophilic third partition 43aa which is formed on the driving element unit 20 to surround the liquid droplet ejection $R_S$, the lyophilic fourth partition 43ab which is formed on the third partition 43aa, and a liquid-repellent second partition 44a which is formed on the fourth partition 43ab. Here, cross-sectional surfaces of the respective partitions are formed such that an opening portion of a lower surface of the fourth partition 43ab becomes larger than an opening portion of an upper surface of the third partition 43aa, and an opening portion of a lower surface of the second partition 44a becomes larger than an opening portion of an upper surface of the fourth partition 43ab. That is, a flat portion 51a is formed in the upper surface of the third partition 43aa, and a flat portion 51b is formed in the upper surface of the fourth partition 43ab.

Further, the third partition 43aa is formed to have the thickness equal to or larger than the thickness of the auxiliary layer 45b which constitutes the functional layer 45 and is formed in a lower portion of the light emitting layer 45a. The fourth partition 43ab is formed to have such a thickness that an upper surface thereof becomes higher than an upper surface of the light emitting layer 45a. As an example satisfying these conditions, a structure in which the third partition 43aa has the thickness sufficiently larger than the thickness of the auxiliary layer 45b, and the third and fourth partitions 43aa and 43ab have the thickness sufficiently larger than the thickness of the functional layer 45 may be exemplified. The third and fourth partitions 43aa and 43ab are made of a lyophilic inorganic material such as $SiO_2$ or $TiO_2$, but, in the present invention, depending on the nature of the composition for forming the auxiliary layer 45b or the light emitting layer 45a, a suitable material may be selected.

Preferably, the third partition 43aa has a lyophilic property higher than the fourth partition 43ab, and the second partition 44a has a lyophilic property higher than the fourth partition 43ab. That is, in the case in which the functional layer 45 is provided with the auxiliary layer 45b and the light emitting layer 45a, at the time of forming the auxiliary layer 45b, preferably, the third partition 43aa exhibits a lyophilic property and the second partition 44a or the fourth partition 43ab exhibits a liquid-repellent property. Further, at the time of forming the light emitting layer 45a, preferably, the fourth partition 43ab exhibits a lyophilic property and the second partition 44a exhibits a liquid-repellent property. More specifically, as the third partition 43aa, silicon oxide film having low carbon content is selected, and as fourth partition 43ab, silicon oxide film having carbon content higher than that of the third partition 43aa and lower than that of the second partition 44a is selected. Subsequently, by performing a fluorine plasma treatment using gas such as $CF_4$, $SF_6$, CHF$_3$ or the like, the fourth partition 43ab may have a liquid-repellent property higher than that of the third partition 43aa and the second partition 44a may have a liquid-repellent property higher than that of the fourth partition 43ab. Further, as the fourth partition 43ab, silicon oxide film containing fluorine atoms may be selected. In addition, by making the side inclined angle of the third partition 43aa being larger than the side inclined angle of the fourth partition 43ab and by performing the fluorine plasma treatment having anisotropy to the vertical direction of the substrate, the third partition 43aa may have a lyophilic property higher than that of the fourth partition 43ab. According to this construction, it is possible to make the thickness of the auxiliary layer 45b and the light emitting layer 45a uniform.

Further, the auxiliary layer 45b may be the hole transporting layer and as a material of the hole injecting/transporting layer, polythiophene derivatives such as polyethylenedioxythiophene and aqueous dispersing solution such as polystyrene sulfonate may be used. Further, as a material of the light emitting layer 45a, a solution in which poly (paraphenylenevinylene)(PPV) derivatives, polyphenylene derivatives, polyfluorene-derivatives are melted may be used. In this case, a composition constituting the hole transporting layer has the nature close to water, and a composition constituting the light emitting layer 45a has the nature close to oil. Thus, as a material of the third partition 43aa, a material having a lyophilic property higher than that of the fourth partition 43ab is preferably selected.

When the functional layer having a plurality of layers is formed by arranging liquid droplets within the partition using a liquid droplet ejection method, the layers are preferably formed sequentially beginning with a liquid having lyophilic property. This is because it is possible to control the wettability of the liquid to the substrate and the pixel electrode made of an inorganic material in a thin film forming region and it is possible to arrange the liquid in the entire thin film forming region. To the contrary, in the case in which, after forming a portion of one functional layer made of an organic material in the thin film forming region, another functional layer is formed thereon from lyophilic liquid droplets, a liquid-repellent property is exhibited between the liquid droplets and the portion of the functional layer made of the inorganic material. Thus, it is difficult to arrange the liquid in the entire thin film forming region. Further, in particular, in case of forming the OLED element, as a material of the cathode 46, the electron injecting layer or the electron transporting layer, alkali metallic materials, alkali earth metallic materials, or alloys or compounds thereof, of which a work function is 3.5 eV (electron volts) or less, may be used. The cathode 46, the electron injecting layer or the electron transporting layer is preferably formed separately using a lyophilic liquid in that reliability of the OLED element is improved. Therefore, the third partition 43aa is preferably made of a material having a lyophilic property higher than that of the fourth partition 43ab.

The second partition 44a may be made of a material having a liquid-repellent property or a material which obtain a liquid-repellent property by means of the plasma treatment (for example, fluoridation) even though it has no liquid-repellent property inherently. As the second partition 44a, an insulating organic material, such as polyimide resin or acryl resin, which can exhibit a liquid-repellent property (for example, fluoridation) and close adherence to the underlying fourth partition 43ab through the plasma treatment, and can be easily patterned with the photolithography method, may be included. Similarly to the first embodiment, the side inclined angle of the second partition 44a is formed to be larger than the side inclined angles of the third and fourth partitions 43aa and 43ab. Moreover, the size relationship of the side inclined angle of the third partition 43aa and the side inclined angle of the fourth partition 43ab is not particularly limited. In such a manner, the light emitting layer 45a and the auxiliary layer 45b of which the surfaces have approximately uniform flatness are formed.

By constructing the partition 42a in such a manner, even though the thin film is formed by drying the liquid droplets which are dropped in the liquid droplet ejection region with the ink jet process or the amount of the liquid droplets to be dropped is changed somewhat, the liquid droplets are dried which maintaining the uniform thickness, and further the height of the surface of the functional layer 45 from the surface of the substrate 10 after drying is overall maintained approximately uniformly.

Here, as regards the auxiliary layer 45b, even though the auxiliary layer 45b is provided with a plurality of layers, these layers are collectively referred to as the auxiliary layer 45b. More specifically, referring to FIG. 9 (FIG. 2), since the anode 41 is formed at the side of the substrate 10, the auxiliary layer 45b serves as a hole transporting layer and/or a hole injecting layer. For example, in the case in which the hole transporting layer and/or the hole injecting layer are formed as the auxiliary layer 45b, a laminated structure of the hole transporting layer and the hole injecting layer is collectively referred to as the auxiliary layer 45b.

Further, similarly to the first embodiment, preferably, the first partition 43a has the thickness sufficiently larger than the thickness of the functional layer 45, and the second partition 44a is formed on the first partition 43a such that the upper surface portion of the first partition 43a does not appear as viewed from the upper portion. That is, since the second partition 44a is formed on the fourth partition 43ab such that the upper surface portion of the fourth partition 43ab does not appear as viewed from the upper portion, it is possible to suppress unevenness in a heightwise direction of the surface of the functional layer 45 without remaining the liquid droplets in a portion of the lyophilic fourth partition 43ab. Further, preferably, the third partition 43aa has the thickness sufficiently larger than the thickness of at least the auxiliary layer, and the fourth partition 43ab is formed on the third partition 43aa such that the upper surface portion of the third partition 43aa does not appear as viewed from the upper portion. In such a manner, it is possible to suppress unevenness in a heightwise direction of the surface of the auxiliary layer 45b without remaining the liquid droplets in the lyophilic third partition 43aa portion.

Moreover, other elements are the same as those of the first embodiment, the same elements are denoted by the same reference numerals as those of the first embodiment, and thus the descriptions on the same elements will be omitted. Further, a manufacturing method of an electro-optical device having a construction according to the second embodiment is the same sequence as that of the first embodiment, except that 'the first partition forming step' of the step S3 of FIG. 5 in the first embodiment is changed into 'a third and fourth partition forming step' in which the third partition 43aa and the fourth partition 43ab made of a lyophilic inorganic material are sequentially formed. Thus, here, the detailed description on the manufacturing method will be omitted.

According to the second embodiment, it has advantages that it is possible to make the thickness of a region surrounded by the opening portion of the lower surface of the third partition 43aa uniform in the light emitting layer 45a and the auxiliary layer 45b formed by drying the liquid droplets, and it is possible to make flatness of the surface of the respective layers uniform.

3. Third Embodiment

In a third embodiment, an electro-optical device having a rectangular liquid droplet ejection region in which the thickness is uniform in a region surrounded by the first partition and the height of the surface of the functional layer is uniform in the liquid droplet ejection region will be described.

Figure 10:
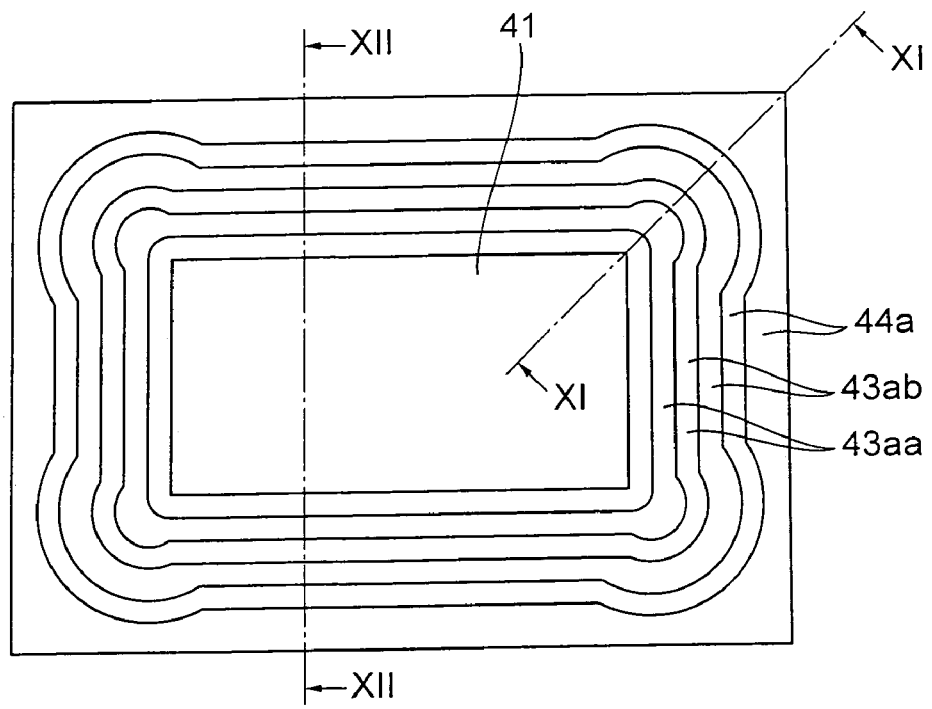
FIG. 10 is a planar schematic view of a third embodiment of an electro-optical device according to the present invention.
Figure 11:
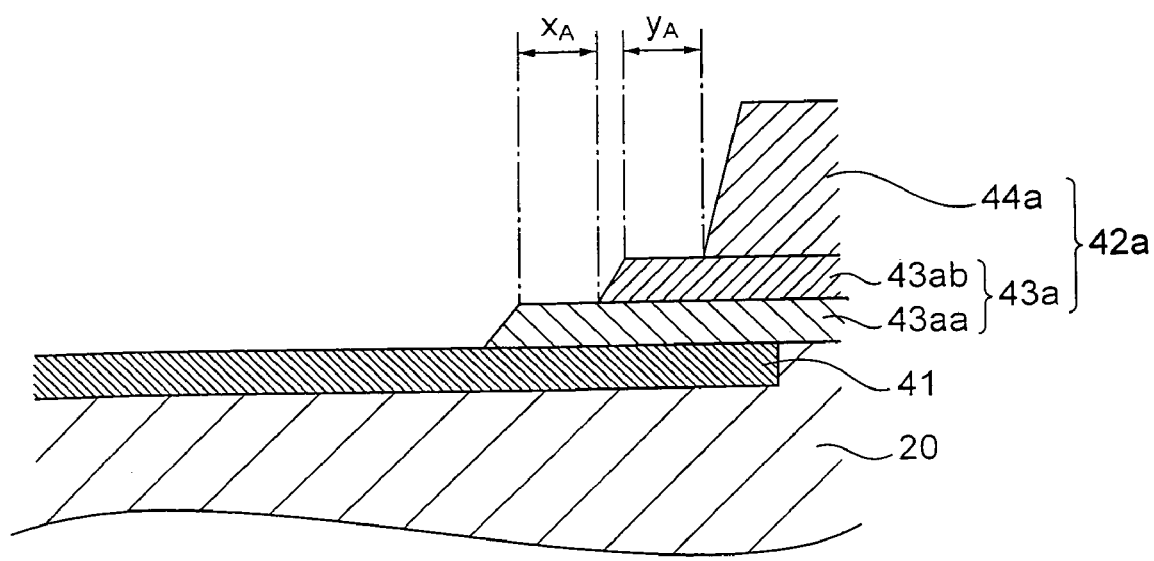
FIG. 11 is a cross-sectional view taken along line XI-XI of FIG. 10.
Figure 12:
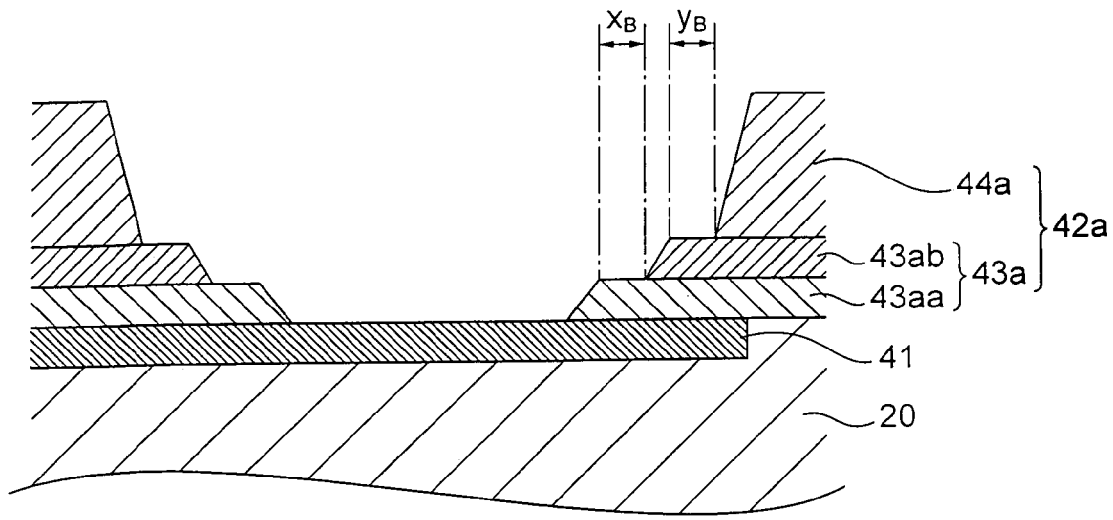
FIG. 12 is a cross-sectional view taken along line XII-XII of FIG. 10.

FIG. 10 is a plan view showing a construction of a third embodiment of an electro-optical device according to the present invention, FIG. 11 is a cross-sectional view taken along line XI-XI of FIG. 10, and FIG. 12 is a cross-sectional view taken along line XII-XII of FIG. 10. In FIGS. 10 to 12, only the liquid droplet ejection region and the peripheral portion of the partition are shown. In the electro-optical device according to the third embodiment, the cross-sectional surfaces are similar to those shown in FIG. 9 of the second embodiment. That is, the partition 42a is a three-layer structure of the third and fourth partitions 43aa and 43ab made of the lyophilic inorganic material and the second partition 44a made of the liquid-repellent organic material, and in the upper surfaces of the third and fourth partitions 43aa and 43ab, flat portions are formed. However, in the third embodiment, in the cross-sectional surfaces of the second and fourth partitions 44a and 43ab parallel to the substrate surface, respective angled portions have a round shape such as a circular arc. That is, the sides of the second and fourth partitions 44a and 43ab extending to the angled portions of the liquid droplet ejection region are constructed to have semi-conical surface-shaped inclinations respectively. Further, as shown in FIGS. 11 and 12, the outline of the opening portion of the partition 42a is formed such that the widths $x_A$ and $y_A$ of the flat portions to be formed on the upper surfaces of the third and fourth partitions 43aa and 43ab in a circular arc-shaped portion becomes longer respectively than the widths $x_B$ and $y_B$ of the flat portions to be formed on the upper surfaces of the third and fourth partitions 43aa and 43ab in a linear portion. In such a manner, when the liquid droplets ejected in the liquid droplet ejection region are dried, there is no case in which the liquid droplets remain on the third and fourth partitions 43aa and 43ab in the vicinities of the angled portions of the liquid droplet ejection region. Moreover, other elements are the same as those of the electro-optical device described in the second embodiment, and further a manufacturing method thereof is the same as the manufacturing method described in the first and second embodiments, and thus the detailed descriptions on the same elements and the manufacturing method will be omitted.

According to the third embodiment, since the sides of the partition 42a in the vicinities of the angled portions of the liquid droplet ejection region are in a semi-conical surface shape, it has an advantage that it is possible to maintain flatness of the functional layer 45 to be formed in the liquid droplet ejection region uniformly. Further, as seen from FIG. 10 showing an embodiment of the present invention, since the liquid droplet ejection region can be made perfect rectangular, it has advantages that it is possible to widen the area of the liquid droplet ejection region (that is, the area of the light emitting region), and it is also possible to increase brightness the respective light emitting regions.

Moreover, in the above description, the rectangular liquid droplet ejection region is exemplified. However, generally, in the liquid droplet ejection region having the angled portions, by making the sides of the second and fourth partitions 44a and 43ab extending to the angled portions in a round semi-conical shape, the same advantages can be obtained. Further, in the above description, both sides of the second and fourth partitions 44a and 43ab extending to the angled portions of the liquid droplet ejection region are made in a round semi-conical shape, but, in the present invention, the shape of the cross-sectional surface of any one of the second partition 44a and the fourth partition 43ab parallel to the substrate surface may have a rectangular shape.

4. Fourth Embodiment

Figure 13:
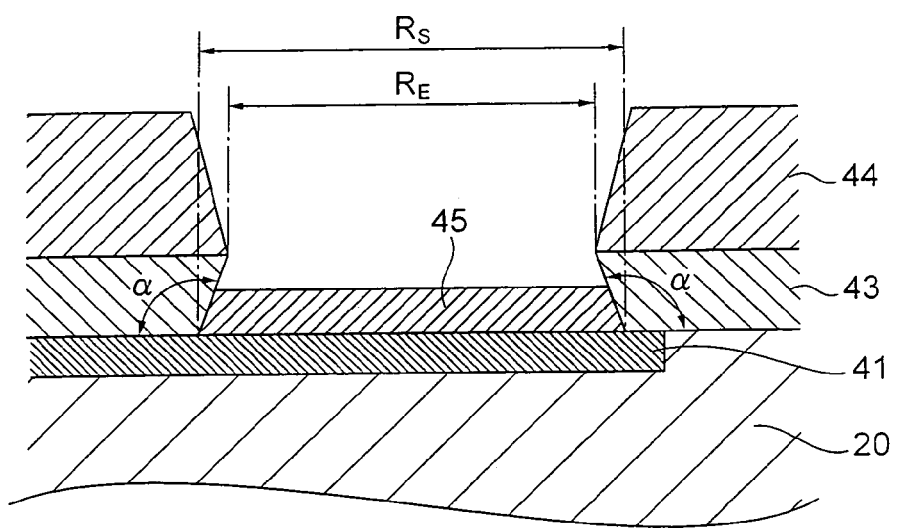
FIG. 13 is a cross-sectional schematic view of a fourth embodiment of an electro-optical device according to the present invention.

FIG. 13 is a cross-sectional view showing a fourth embodiment of an electro-optical device according to the present invention. FIG. 13 is an expanded view of the partition portion 42 of FIG. 2 in the first embodiment. Moreover, the same elements are denoted by the same reference numerals as those of the first embodiment, and the detailed description on the same elements will be omitted. Further, the electro-optical device having such a construction can be manufactured by the same manufacturing method as that described in the first embodiment, except for the step of forming the first partition 43, and the descriptions thereon will be omitted.

In the fourth embodiment, the first partition 43 in the first embodiment is formed such that the side inclined angle α of the first partition 43 has an obtuse angle or a right angle. That is, the cross-sectional surface of the first partition 43 is in an inversely tapered shape. In such a construction, the liquid droplet ejection region $R_S$ is different from the light emitting region $R_E$. Specifically, the liquid droplet ejection region $R_S$ is a region which is surrounded by a lower end portion of the first partition 43, while the light emitting region $R_E$ is a region which is surrounded by a boundary portion between the first and second partitions 43 and 44. The area of the light emitting region $R_E$ becomes smaller than the area of the liquid droplet ejection region $R_S$. As a result, a circumferential portion of the liquid droplet ejection region $R_S$, in which the liquid droplet ejection region $R_S$ and the light emitting region $R_E$ do not overlap when the light emitting region $R_E$ is projected on the liquid droplet ejection region $R_S$, is shielded by the partition 42 existing in a position corresponding to the circumferential portion and is not observed as the surface of the substrate 10 is observed from the upper portion of the forming side of the functional layer 45. Therefore, only light components emitted within the light emitting region contribute to light emission in the electro-optical device. By making the first partition 43 of photocrosslinkable resin, it is possible to make the cross-sectional surface of the first partition 43 in an inversely tapered shape. Since the first partition 43 has lyophilic property, polysilane-based resin is preferably used.

As described in the first to third embodiments, in the thin film to be formed from the liquid droplets by means of the ink jet process, the contact portion to the first partition 43 results in unevenness. However, according to the fourth embodiment, the portion resulting in unevenness of the thin film is excluded from the light emitting region. That is, even though light emission is performed in the circumferential portion of the liquid droplet ejection region $R_S$ of FIG. 13, light components from that portion are shielded by means of the overlying first and second partitions 43 and 44. In such a manner, it is possible to remove light emission in an uneven portion of the thin film constituting the functional layer 45.

According to the fourth embodiment, it is constructed such that, in the thin film formed in the liquid droplet ejection region $R_S$, light emission from the uneven circumferential portion is shielded. As a result, only light emission in the light emitting region $R_E$ having the uniform thickness in one liquid droplet ejection region $R_S$ is used. Thus, it has an advantage that it is possible to increase uniformity of light emission brightness within the light emitting region $R_E$.

Further, similarly to the first embodiment, the second partition 44 is preferably formed on the first partition 43 such that the upper surface portion of the first partition 43 does not appear as viewed from the upper portion. By constructing the partition 42 in such a manner, even when the thin film is formed by drying liquid droplets which are dropped in the liquid droplet ejection region with the ink jet process, there is no case in which the liquid droplets remain in the lyophilic first partition portion 43. Further, since the cross-sectional surface of the first partition 43 has the inversely tapered shape and the fluorine plasma treatment is performed, the first partition 43 is not exposed to the fluorine plasma treatment, and thus it is possible to prevent the first partition 43 from having a liquid-repellent property as compared with the first embodiment. In particular, by performing the fluorine plasma treatment having anisotropy to the vertical direction of the substrate, it is possible to prevent the first partition 43 from having a liquid-repellent property. Therefore, it is possible to improve the lyophilic property of the first partition 43 and suppress unevenness in the heightwise direction of the surface of the auxiliary layer 45b. Further, it has an advantage that it is possible to increase uniformity of light emission brightness within the light emitting region $R_E$.

5. Fifth Embodiment

Figure 14:
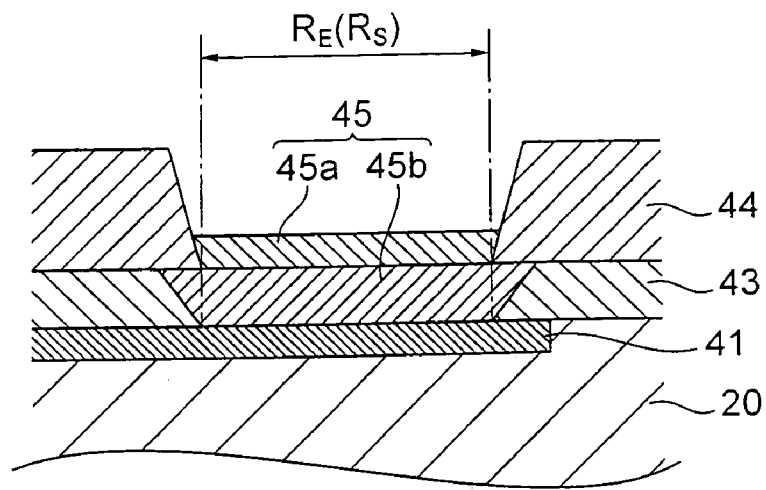
FIG. 14 is a cross-sectional schematic view of a fifth embodiment of an electro-optical device according to the present invention.

FIG. 14 is a cross-sectional view showing a fifth embodiment of an electro-optical device according to the present invention. FIG. 14 is an expanded view of the partition portion 42 of FIG. 2 in the first embodiment. Moreover, the same elements are denoted by the same reference numerals as those of the first embodiment, and the detailed description on the same elements will be omitted. Further, the electro-optical device having such a construction can be manufactured by the same manufacturing method as that described in the first embodiment, except for the step of forming the first partition 43, and the descriptions thereon will be omitted.

In the fifth embodiment, it is necessary that the functional layer 45 is provided with at least two layers of the light emitting layer 45a and the underlying the auxiliary layer 45b. Moreover, as regards the auxiliary layer 45b described herein, even though the auxiliary layer 45b is provided with a plurality of layers, these layers are collectively referred to as the auxiliary layer 45b. More specifically, referring to FIG. 14, since the anode 41 is formed at the side of the substrate 10, the auxiliary layer 45b serves as a hole transporting layer and/or the hole injecting layer. For example, in the case in which the hole transporting layer and/or the hole injecting layer are formed as the auxiliary layer 45b, a laminated structure of the hole transporting layer and the hole injecting layer is collectively referred to as the auxiliary layer 45b.

Further, in the fifth embodiment, the first partition 43 is formed to have the thickness equal to or larger than the thickness of the auxiliary layer 45b to be formed, and the second partition 44 is formed such that the opening portion of a lower end thereof becomes smaller than the opening portion of an upper end of the first partition 43. The lower end of the second partition 44 is formed to further extend than the upper end of the first partition 43 such that unevenness which generates in the contact portion of the auxiliary layer 45b to the first partition 43 is at least hidden as viewed from the upper portion of the forming surface side of the functional layer 45 on the substrate 10. Accordingly, influence by the unevenness in the contact surface of the auxiliary layer 45b to the first partition 43 on the light emitting layer 45a is removed. Moreover, here, the light emitting region $R_E$ is a region which is surrounded by the lower end portion of the second partition 44. Further, in FIG. 14, since the lower end portion of the second partition 44 and the lower end portion of the first partition 43 are aligned with each other, the light emitting region $R_E$ and the liquid droplet ejection region $R_S$ accord with each other.

By using the following step, the opening portion of the lower end of the second partition 44 can become smaller than the opening of the upper end of the first partition 43. First, the first partition is formed on an entire surface of the pixel electrode (anode) 41 or the third interlayer insulating film 28, for example, using an inorganic material such as silicon oxide. Next, a photosensitive organic insulating material is coated on the first partition 43, ultraviolet ray is irradiated thereon via a photo mask, and then development is performed, such that the second partition 44 is formed to surround the liquid droplet ejection region. In addition, using the second partition 44 as a mask, the first partition 43 is patterned using a wet etching solution such as fluoric acid. When the first partition 43 is patterned, etching in a substrate direction is completed, and the surface of the pixel electrode (anode) 41 is exposed. Subsequently, etching is excessively performed, such that the opening portion of the lower end of the second partition 44 can become smaller than the opening portion of the upper end of the first partition 43. Since close adherence of the second partition 44 and the first partition 43 is lower than close adherence of the pixel electrode (anode) 41 and the first partition 43, the wet etching solution is penetrated into an interface of the second partition 44 and the first partition 43, such that such a shape can be made. In the fifth embodiment, the first partition 43 can be made of an inorganic material as compared with the fourth embodiment. Further, since the opening portion of the lower end of the second partition 44 is constructed to further extend than a circumferential portion of the opening portion in the upper end of the first partition 43, and then the fluorine plasma treatment is performed, the first partition 43 is not exposed to the fluorine plasma treatment, and thus it is possible to prevent the first partition 43 from having a liquid-repellent property as compared with the first embodiment. In particular, since the fluorine plasma treatment having anisotropy to the vertical direction of the substrate is performed, it is possible to prevent the first partition 43 from having a liquid-repellent property. Therefore, it is possible to improve lyophilic property of the first partition 43 and it is possible to suppress unevenness in the heightwise direction of the surface of the auxiliary layer 45b.

According to the fifth embodiment, the thickness of the first partition 43 is equal to or larger than that of the auxiliary layer 45b, and the opening portion of the lower end of the second partition 44 extends further than the circumferential portion of the opening portion in the upper end of the first partition 43. Thus, it has advantages that influence by the contact portion of the portion of the auxiliary layer 45b having the not-uniform thickness to the first partition 43 on light emission of the light emitting layer 45a is suppressed, and light emission of uniform brightness within the light emitting region $R_E$ can be attained.

6. Modification

The present invention is not limited to the above-mentioned embodiments, but various modifications can be made.

In the above-mentioned embodiments, the case in which the function element unit 40 having the pixel electrode 41 as the anode and the counter electrode 46 as the cathode is formed is exemplified, but a subject matter of the present invention is not limited to this construction. Alternatively, the function element unit 40 having the pixel electrode 41 as the cathode and the counter electrode 46 as the anode may be formed. In this case, in the second, third, and fifth embodiments, the auxiliary layer 45b serves as an electron transporting layer and/or the electron injecting layer. Further, in an upper portion of the light emitting layer 45a, an auxiliary layer may be additionally formed.

Further, as an example of the electro-optical device, the electro-optical device having the OLED element is exemplified, but the present invention is not limited to this construction. Alternatively, if it uses an electro-optical element of which optical characteristics changes by means of electrical reactions, the present invention can be applied to any one. As such an electro-optical element, an inorganic EL element, a field emission (FE) element, a surface conduction emission (SE) element, a ballistic electron emission (BS) element, other self-light emitting element such as a LED, an electrophoresis element or an electrochromic element may be included. In particular, the present invention can be applied to a current-driven electro-optical element which comprises a partition for separating respective regions to form a plurality of regions on the substrate, a thin film layer to be formed in the region surrounded by the partition, and a pair of electrodes with the thin film layer interposed therebetween, and in which a current flows in the pair of electrodes to activate the thin film layer.

In addition, in the above-mentioned embodiments, the case in which an active matrix type electro-optical device uses the TFT as the driving element or the switching element is described. However, in the present invention, as the driving element or the switching element, a TFD (thin film diode) may be used. Further, instead of the active matrix type electro-optical device, the present invention can be applied similarly to a passive matrix type electro-optical device.

7. Application

Figure 15:
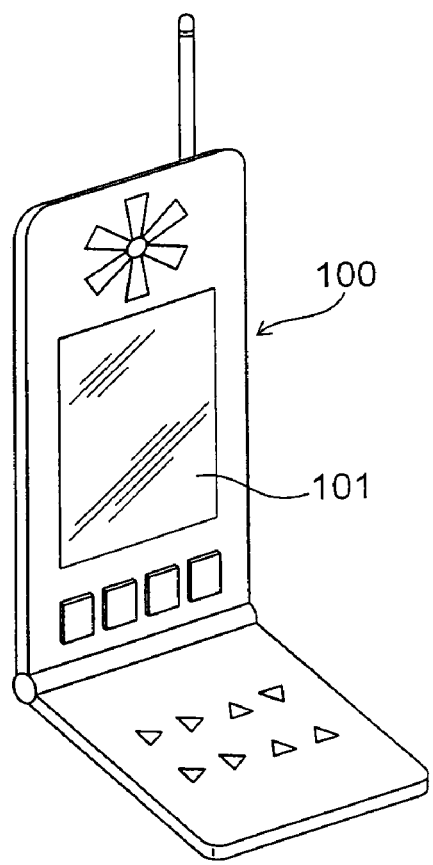
FIG. 15 is a diagram showing an example of an electronic apparatus.
Figure 16:
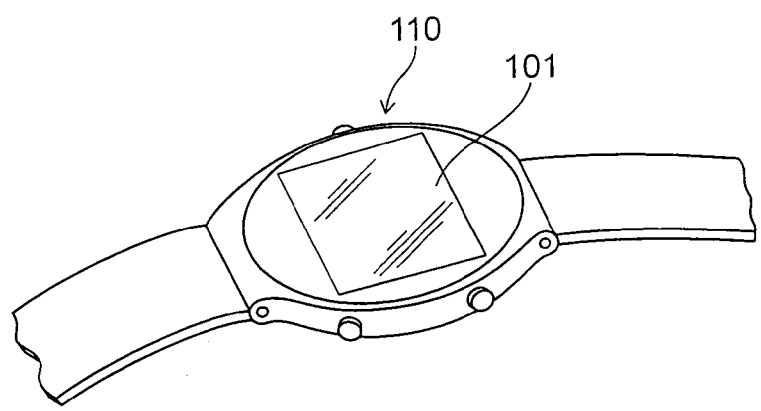
FIG. 16 is a diagram showing an example of an electronic apparatus.
Figure 17:
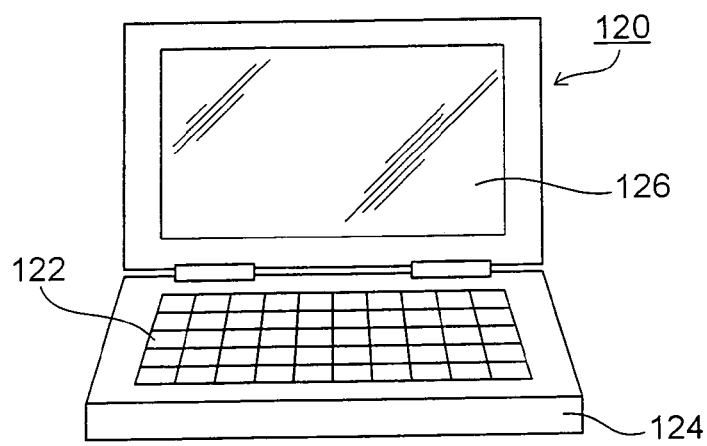
FIG. 17 is a diagram showing an example of an electronic apparatus.
Figure 18:
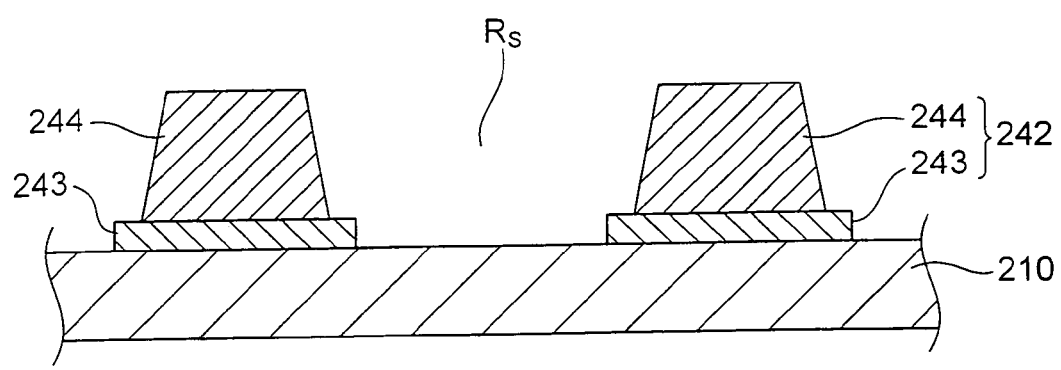
FIG. 18 is a cross-sectional view showing schematically a conventional electro-optical device.
Figure 19:
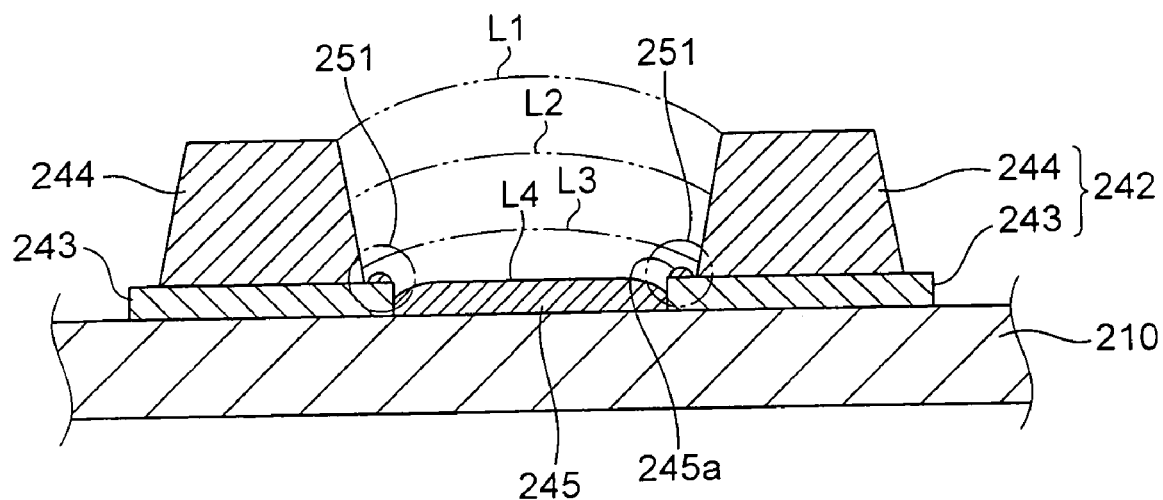
FIG. 19 is a diagram showing schematically a thin film forming step in a conventional electro-optical device.

A specified example of an electronic apparatus comprising the electro-optical device described in the above-mentioned embodiments will be described. FIGS. 15 to 17 show examples of an electronic apparatus in which the electro-optical device according to the present invention is used. FIG. 15 is a perspective view showing an example of a cellular phone. In FIG. 15, the reference numeral 100 denotes a main body of the cellular phone, and the reference numeral 101 denotes a display unit made of the electro-optical device according to the present invention. FIG. 16 is a perspective view of an example of a wrist watch type electronic apparatus. In FIG. 16, the reference numeral 110 denotes a main body of the watch embedded with a watch function, and the reference numeral 111 denotes a display unit made of the electro-optical device of the present invention. And then, FIG. 17 is a perspective view showing an example of a portable information processing device such as a word processor or a personal computer. In FIG. 17, the reference numeral 120 denotes the portable information processing device, the reference numeral 122 denotes an input unit such as a keyboard, the reference numeral 124 denotes a main body unit of the information processing device in which arithmetic means or storing means is housed, and the reference numeral 126 denotes a display unit made of the electro-optical device of the present invention.

Further, as an electronic apparatus comprising such an electro-optical device, other than the cellular phone shown in FIG. 15, the wrist watch type electronic apparatus shown in FIG. 16, and the portable information processing device shown in FIG. 17, fore example, an electronic apparatus comprising an electro-optical device, such as a digital still camera, a vehicle monitor, a digital video camera, a view finder type or monitor-direct-view type video tape recorder, a car navigation device, a pager, an electronic organizer, an electronic calculator, a workstation, a videophone, a POS terminal, or the like may be exemplified. Further, the present invention may be applied to an image forming device such as a write head for an optical write type printer or an electronic copying machine. Therefore, it is needless to say that the present invention may be applied to an electrical connection structure of such an electronic apparatus.

INDUSTRIAL AVAILABILITY

As described above, an electro-optical device according to the present invention is useful for a display device and an image forming device in which a plurality of pixels are formed and which is capable of controlling display state for every pixel.

What is claimed is:

1. An electro-optical device comprising:
    partitions for separating a plurality of regions formed on a substrate, each partition having a lyophilic first partition which, in each region, has a side portion and an upper surface portion surrounding the region and a liquid-repellent second partition which is formed on at least a portion of the upper surface portion of the first partition;
    a functional layer which is formed on the region surrounded by the partition and has at least a light emitting layer; and
    a pair of electrodes with the functional layer interposed therebetween,
    wherein the thickness of the first partition is larger than the thickness of the functional layer, and
    an inclined angle of the side portion of the first partition surrounding the region is less than an inclined angle of a side portion of the second partition surrounding the region.
2. The electro-optical device according to claim 1, wherein the second partition is formed to entirely cover the upper surface portion of the first partition.
3. The electro-optical device according to claim 1, wherein the first partition has:
    a lyophilic third partition having a side portion and an upper surface portion to surround the region; and
    a lyophilic fourth partition which is formed on at least a portion of the upper surface portion of the third partition.
4. The electro-optical device according to claim 3, wherein the functional layer has an auxiliary layer, which is formed as a lower layer of the light emitting layer, for assisting light emission by the light emitting layer,
    the thickness of the third partition is larger than the thickness of the auxiliary layer, and the inclined angle of the side portion of the second partition is greater than inclined angles of the side portions of the third and fourth partitions.

5. The electro-optical device according to claim 3, wherein the functional layer has an auxiliary layer, which is formed as a lower layer of the light emitting layer, for assisting light emission by the light emitting layer, the thickness of the third partition is larger than the thickness of the auxiliary layer, and the thickness of the first partition is larger than the thickness of the functional layer.

6. The electro-optical device according to claim 3, wherein the third partition has a lyophilic property higher than that of the fourth partition, and the second partition has a liquid-repellent property higher than that of the fourth partition.

7. The electro-optical device according to claim 3, wherein the region has a polygonal shape, in an opening portion of the second or third partition, a cross-sectional surface shape in a horizontal plane direction has a round shape in the vicinities of angled portions of the region, and the width of a flat portion of the third or fourth partition in the vicinities of the angled portions is longer than the widths of other portions in the vicinities of the angled portions.

8. An electronic apparatus comprising an electro-optical device as claimed in claim 1.

* * * * *